United States Patent
Choi et al.

(10) Patent No.: US 7,797,607 B2
(45) Date of Patent: Sep. 14, 2010

(54) DTV TRANSMITTER AND METHOD OF CODING MAIN AND ENHANCED DATA IN DTV TRANSMITTER

(75) Inventors: In Hwan Choi, Gyeonggi-do (KR); Kyung Won Kang, Seoul (KR); Kook Yeon Kwak, Gyeonggi-do (KR)

(73) Assignee: LG Electronics, Inc., Seoul (KR)

( * ) Notice: Subject to any disclaimer, the term of this patent is extended or adjusted under 35 U.S.C. 154(b) by 791 days.

(21) Appl. No.: 11/616,784

(22) Filed: Dec. 27, 2006

(65) Prior Publication Data

US 2007/0180350 A1  Aug. 2, 2007

Related U.S. Application Data

(60) Provisional application No. 60/868,296, filed on Dec. 1, 2006.

(30) Foreign Application Priority Data

Dec. 27, 2005 (KR) ...................... 10-2005-0131082

(51) Int. Cl.
*H03M 13/00* (2006.01)

(52) U.S. Cl. ...................................... 714/752; 375/270

(58) Field of Classification Search .................. 714/752, 714/755, 758; 375/270

See application file for complete search history.

(56) References Cited

U.S. PATENT DOCUMENTS

| 7,111,221 B2 * | 9/2006 | Birru et al. ................... 714/755 |
| 7,653,143 B2 * | 1/2010 | Kim et al. ................... 375/270 |
| 2001/0034867 A1 | 10/2001 | Jaffe et al. |
| 2005/0097428 A1 | 5/2005 | Chang et al. |

FOREIGN PATENT DOCUMENTS

| KR | 10-2001-0111667 A | 12/2001 |
| WO | WO 02-080559 A2 | 10/2002 |

\* cited by examiner

*Primary Examiner*—Sam Rizk
(74) *Attorney, Agent, or Firm*—Lee, Hong, Degerman, Kang & Waimey

(57) ABSTRACT

A DTV transmitter includes a pre-processor pre-processing enhanced data, a data formatter generating enhanced data packets including the pre-processed enhanced data, and a multiplexer multiplexing the enhanced data packets with main data packets. The transmitter further includes an RS encoder RS-coding the multiplexed packets by adding systematic RS parity data to each main data packet and by adding non-systematic RS parity place holders to each enhanced data packet, and a data interleaver interleaving the RS-coded packets. The non-systematic RS parity place holders are placed after the enhanced data within each interleaved enhanced data packet, and a sequence of known data place holders is periodically included in the interleaved enhanced data packets.

8 Claims, 22 Drawing Sheets

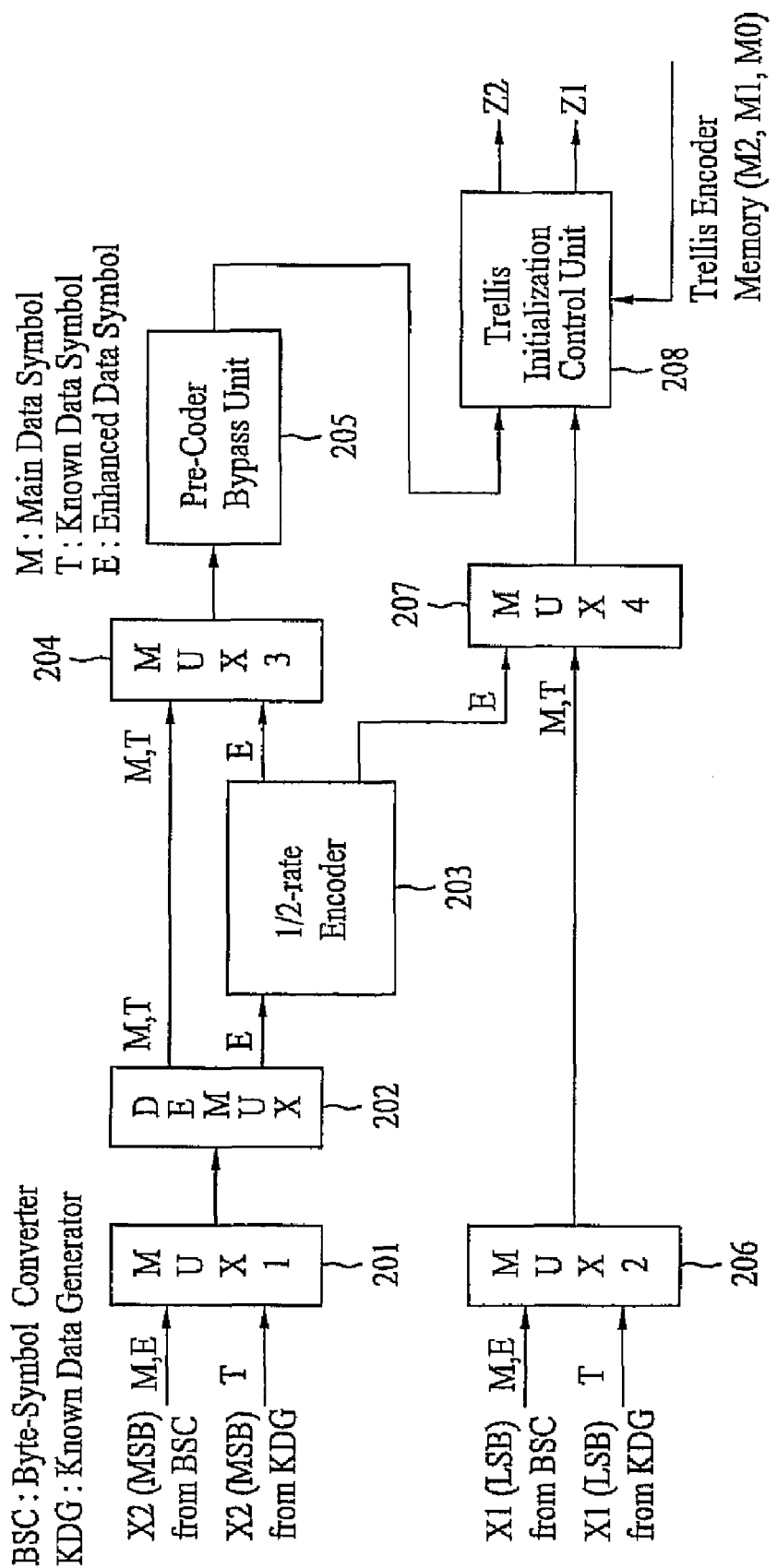

Byte Expansion
by null bit insertion
(1 byte => 2 bytes)

Byte Expansion
by null bit insertion
(1 byte => 2 bytes)

Byte Expansion
by bit repetition
(1 byte => 2 bytes)

Byte Expansion by null bit insertion (1 byte => 4 bytes)

Byte Expansion by null bit insertion (1 byte => 4 bytes)

| M2M1M0 | 1st Z2Z1/2nd Z2Z1 |
|---|---|
| 000 | 00/00 or 10/10 |
| 001 | 00/01 or 10/11 |
| 010 | 01/00 or 11/10 |
| 011 | 01/01 or 11/11 |
| 100 | 00/10 or 10/00 |
| 101 | 00/11 or 10/01 |
| 110 | 01/10 or 11/00 |
| 111 | 01/11 or 11/01 |

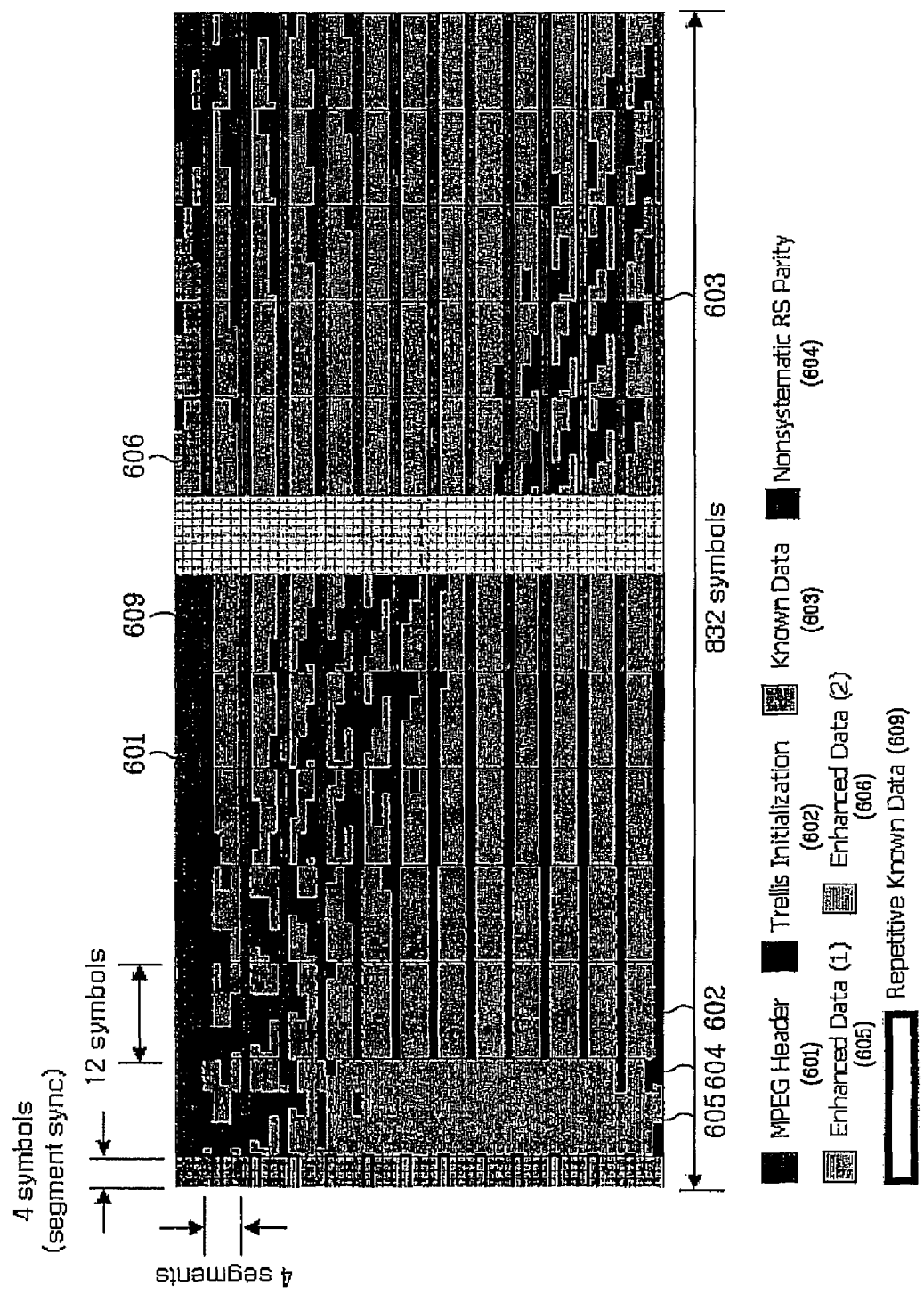

DTV TRANSMITTER AND METHOD OF CODING MAIN AND ENHANCED DATA IN DTV TRANSMITTER

This application claims the benefit of the Korean Patent Application No. 10-2005-0131082, filed on Dec. 27, 2005, which is hereby incorporated by reference as if fully set forth herein. This application also claims the benefit of U.S. Provisional Application No. 60/868,296, filed on Dec. 1, 2006, which is hereby incorporated by reference.

BACKGROUND OF THE INVENTION

1. Field of the Invention

The present invention relates to a digital telecommunications system, and more particularly, to a DTV transmitter and a method of coding main and enhanced data in a DTV transmitter.

2. Discussion of the Related Art

Presently, the technology for processing digital signals is being developed at a vast rate, and, as a larger number of the population uses the Internet, digital electric appliances, computers, and the Internet are being integrated. Therefore, in order to meet with the various requirements of the users, a system that can transmit diverse supplemental information in addition to video/audio data through a digital television channel needs to be developed.

Some users may assume that supplemental data broadcasting would be applied by using a PC card or a portable device having a simple in-door antenna attached thereto. However, when used indoors, the intensity of the signals may decrease due to a blockage caused by the walls or disturbance caused by approaching or proximate mobile objects. Accordingly, the quality of the received digital signals may be deteriorated due to a ghost effect and noise caused by reflected waves. However, unlike the general video/audio data, when transmitting the supplemental data, the data that is to be transmitted should have a low error ratio. More specifically, in case of the video/audio data, errors that are not perceived or acknowledged through the eyes or ears of the user can be ignored, since they do not cause any or much trouble. Conversely, in case of the supplemental data (e.g., program execution file, stock information, etc.), an error even in a single bit may cause a serious problem. Therefore, a system highly resistant to ghost effects and noise is required to be developed.

The supplemental data are generally transmitted by a time-division method through the same channel as the video/audio data. However, with the advent of digital broadcasting, digital television receivers that receive only video/audio data are already supplied to the market. Therefore, the supplemental data that are transmitted through the same channel as the video/audio data should not influence the conventional receivers that are provided in the market. In other words, this may be defined as the compatibility of broadcast system, and the supplemental data broadcast system should be compatible with the broadcast system. Herein, the supplemental data may also be referred to as enhanced data. Furthermore, in a poor channel environment, the receiving performance of the conventional receiver may be deteriorated. More specifically, resistance to changes in channels and noise is more highly required when using portable and/or mobile receivers.

SUMMARY OF THE INVENTION

Accordingly, the present invention is directed to a DTV transmitter and a method of coding main and enhanced data in a DTV transmitter that substantially obviate one or more problems due to limitations and disadvantages of the related art.

An object of the present invention is to provide a DTV transmitter and a method of coding main and enhanced data in a DTV transmitter that is suitable for transmitting supplemental data and that is highly resistant to noise.

Another object of the present invention is to provide a DTV transmitter and a method of coding main and enhanced data in a DTV transmitter that can insert known data in a specific domain of the supplemental data and transmit the data to a DTV receiver, thereby enhancing the receiving performance of the DTV receiver.

A further object of the present invention is to provide a DTV transmitter and a method of coding main and enhanced data in a DTV transmitter for efficiently inserting and transmitting the known data.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital television (DTV) transmitter includes a pre-processor, a data formatter, a multiplexer, an RS encoder, and a data interleaver. The pre-processor pre-processes enhanced data by coding the enhanced data for forward error correction (FEC) and expanding the FEC-coded enhanced data. The data formatter generates enhanced data packets including the pre-processed enhanced data and inserts known data place holders to be replaced with known data into the enhanced data packets. The multiplexer multiplexes the enhanced data packets with main data packets including main data.

The RS encoder included in the DTV transmitter RS-codes the multiplexed main and enhanced data packets. It adds systematic RS parity data to each main data packet and adds non-systematic RS parity place holders to each enhanced data packet. The data interleaver interleaves the RS-coded main and enhanced data packets. The RS encoder determines locations of the non-systematic RS parity place holders which are added to each enhanced data packet such that the non-systematic RS parity place holders are placed after the enhanced data in each enhanced data packet interleaved by the data interleaver. In addition, the data formatter determines locations of the known data place holders which are added into the enhanced data packets such that a sequence of known data place holders is periodically repeated in the enhanced data packets interleaved by the data interleaver. The data interleaver may further replace the RS parity place holders included in each interleaved enhanced data packet with non-systematic RS parity data.

The DTV transmitter according to the present invention may further include a known data generator, a byte-symbol converter, a symbol processor, and a trellis encoder. The known data generates symbols representing a known data sequence. The converter converts the interleaved data packets into corresponding symbols. The symbol processor processes the converted symbols. For example, it encodes symbols corresponding to the enhanced data, replaces symbols corresponding to the sequence of known data place holders with the symbols generated by the known data generator, and further replaces symbols representing a beginning of the known data sequence with initialization data. The trellis encoder trellis-encodes the symbols processed by the symbol processor. The trellis encoder is initialized when the symbol processor outputs the initialization data to the trellis encoder.

In an enhanced data packet interleaved by the data interleaver, a portion of the sequence of known data place holders which corresponds to the beginning of the known data sequence is placed before the non-systematic RS parity place holders. In addition, the remaining portion of the sequence of known data place holders may be placed before or after the non-systematic RS parity place holders within the interleaved enhanced data packet.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 2A illustrates a block diagram of a symbol processor according to an embodiment of the present invention;

FIG. 7A to FIG. 7C illustrate exemplary configurations of an enhanced data packet group having known data inserted therein according to a first embodiment of the present invention;

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

In the present invention, the enhanced data may either consist of data including information such as program execution files, stock information, and so on, or consist of video/audio data. Additionally, the known data refer to data already known based upon a pre-determined agreement between the transmitter and the receiver. Furthermore, the main data consist of data that can be received from the conventional receiver, wherein the main data include video/audio data.

The present invention relates to inserting known data known by the transmitter/receiver in a specific position of an enhanced data packet and transmitting the processed data packet, thereby enhancing the receiving performance of the receiver. Most particularly, the present invention relates to multiplexing the enhanced data including the known data and the main data in packet units, thereby performing additional encoding of only the enhanced data when encoding the multiplexed data in a symbol domain. Finally, the present invention enables a long known data sequence to be inserted consecutively, thereby enhancing the degree of freedom for deciding the inserting position of the known data sequence.

Figure 1:
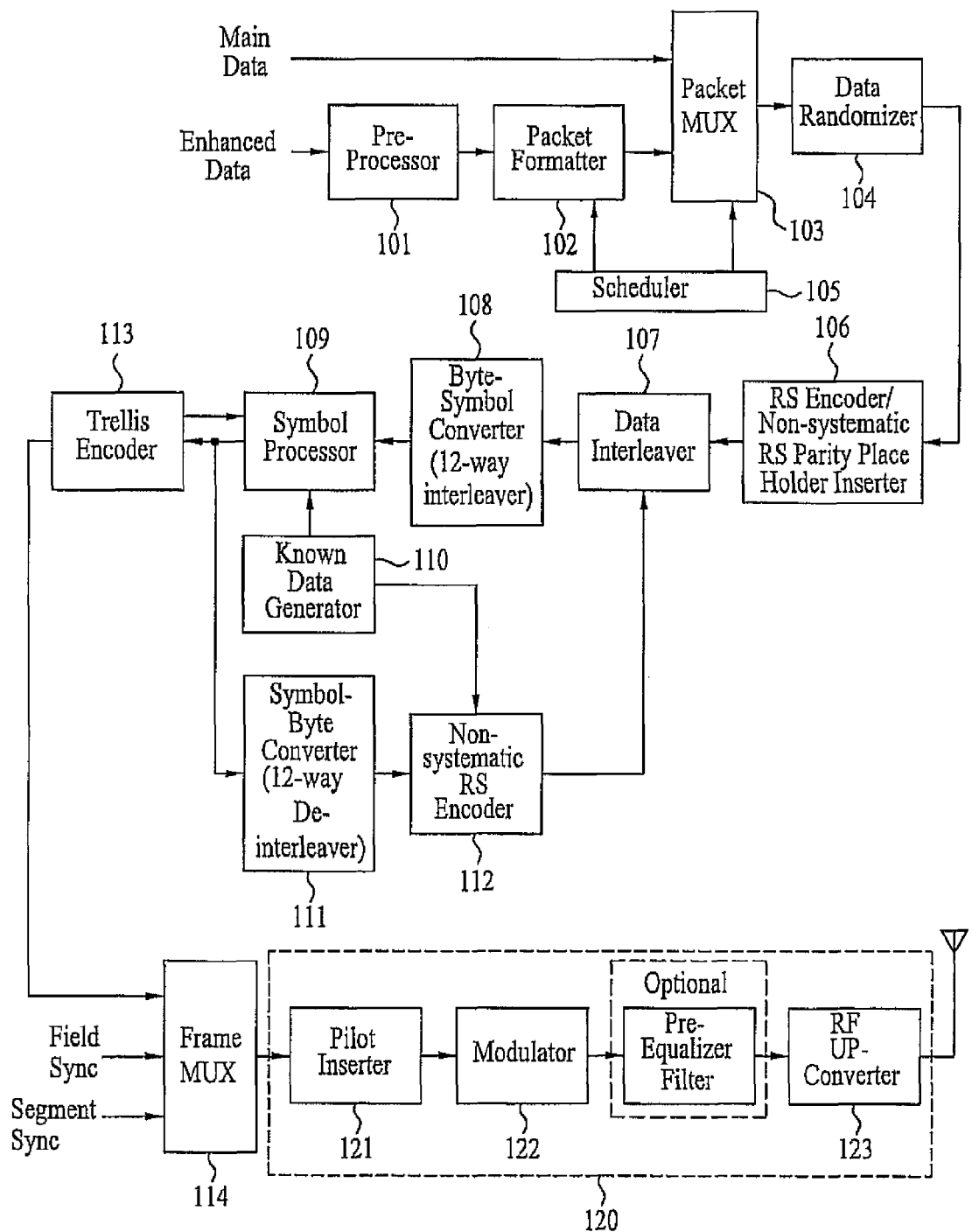
FIG. 1 illustrates a block diagram of a digital broadcast (or television or DTV) transmitter according to the present invention.

FIG. 1 illustrates a block diagram of a digital television receiver according to the present invention. The digital television receiver includes a pre-processor 101, a packet formatter 102, a packet multiplexer 103, a data randomizer 104, a scheduler 105, a Reed-Solomon (RS) encoder/non-systematic Reed-Solomon (RS) parity place holder inserter 106, a data interleaver 107, a byte-symbol converter 108, a symbol processor 109, a known data generator 110, a symbol-byte converter 111, a non-systematic RS encoder 112, a trellis encoder 113, a frame multiplexer 114, and a transmitter 120. In the present invention having the above-described structure, a main data packet is outputted to the packet multiplexer 103, and enhanced data are outputted to the pre-processor 101. The pre-processor 101 pre-processes the enhanced data, such as encoding additional error correction, interleaving, and inserting null data, and then outputs the pre-processed enhanced data to the packet formatter 102.

Based upon the control of the scheduler 105, the packet formatter 102 multiplexes the pre-processed enhanced data and the known data place holder, thereby configuring a group. Herein, the known data place holder ensures in advance the position (or place) in which the known data are to be inserted in a later process. Also, the known data place holder may be given an arbitrary value. The data within the group are then divided into 184-byte unit enhanced data packets, and a 4-byte MPEG header is added to the beginning of the enhanced data packet, thereby outputting a 188-byte enhanced data packet (i.e., a MPEG-2 Transport packet). Herein, the MPEG header is configured of a MPEG synchronization data byte (0x47) and 3 data bytes including packet identification (PID). In addition, one enhanced data packet group includes a plurality of consecutive enhanced data packets.

The output of the packet formatter 102 is inputted to the packet multiplexer 103. The packet multiplexer 103 time-division multiplexes the main data packet and the enhanced data packet group in transport stream (TS) packet units and outputs the multiplexed TS packet in accordance with the control of the scheduler 105. More specifically, the scheduler 105 generates and outputs a control signal so that the packet formatter 102 can multiplex the enhanced data and the known data place holders, and generates and outputs another control signal so that the packet multiplexer 103 can multiplex the main data packet and the enhanced data packet group. Accordingly, the packet multiplexer 103 receives the control signal, thereby multiplexing and outputting the main data packet and the enhanced data packet group to TS packet units.

The output data of the packet multiplexer 103 are inputted to the data randomizer 104. The data randomizer 104 discards (or deletes) the MPEG synchronization byte and randomizes the remaining 187 bytes by using a pseudo-random byte, which is generated from inside the data randomizer 104. Thereafter, the randomized data are outputted to the Reed-Solomon (RS) encoder/non-systematic RS parity place holder inserter 106. The RS encoder/non-systematic RS parity place holder inserter 106 processes the randomized data with either a systematic RS-coding process or a non-systematic RS parity place holder insertion process. More specifically, when the 187-byte packet that is outputted from the data randomizer 104 corresponds to the main data packet, RS encoder/non-systematic RS parity place holder inserter 106 performs the same systematic RS-coding as the conventional broadcast system, thereby adding a 20-byte parity byte at the end of the 187-byte data and outputting a 207-byte packet. The rule (or principle) of inserting the 20 null data bytes within the enhanced data packet will be described in a later process. Herein, the null byte may be given an arbitrary value, and such null byte value may be substituted with the parity value calculated by the non-systematic RS encoder 112 in a later process. Accordingly, the role of the null byte is to ensure the parity byte position of a non-systematic RS code.

The non-systematic RS code is used for the enhanced data packet for the following reason. When the value of the enhanced data is changed by the symbol processor 109, which will be described in detail in a later process, the RS parity should be recalculated. And so, the parity bytes should be outputted from the data interleaver 107 output terminal later than the data bytes. For example, when K number of data bytes are received and P number of parity bytes are added thereto so as to be RS-coded, P number of arbitrary bytes among the total N(=K+P) number of bytes may be used as the parity bytes.

The output of the RS encoder/non-systematic RS parity place holder inserter 106 is configured of a 207-byte packet. The order in which the bytes within the packet are outputted by the data interleaver 107 is decided in accordance with Equation 1 below.

$$b = ((52 \times p) + (s \bmod 52)) \bmod 207, \ p=0,1,\ldots 206 \quad \text{Equation 1}$$

Herein, s indicates a segment (or packet) number following the field synchronization signal, and the value of s ranges from 0 to 311. Also, b indicates a byte position within the segment (or packet), and the value of b ranges from 0 to 206. More specifically, s and b respectively represents each position of the segment (or packet) and the byte position both being inputted to the data interleaver 107. Furthermore, 52 indicates an invariable number pre-decided by the data interleaver 107. And, finally, mod signifies a modulo operation.

Generally, in the broadcast system, one transport packet is interleaved by the data interleaver, thereby being dispersed and outputted by a plurality of data segments. However, since one 207-byte packet has the data size equal to that of one data segment, the packet may also be named as a segment prior to the interleaving process. Therefore, when the values 0 to 206 are respectively substituted for p, the obtained value b represents the position (or place) of the parity byte being serially outputted at the output end of the data interleaver 107. For example, in the above Equation 1, in the first segment (wherein s=0), when the values p=0 to p=206 are respectively substituted, the data are outputted by the data interleaver 107 in a byte order of b=0, 52, 104, 156, 1, 53, 105, 157, and so on.

Accordingly, when the input data correspond to the enhanced data packet, the RS encoder/non-systematic RS parity place holder inserter 106 inserts a non-systematic RS parity place holder in a 20-byte place being outputted the latest from the output end of the data interleaver 107 among the byte places excluding the MPEG header byte place and the known data byte place. Herein, the position of the known data place holder to be used for initializing the trellis encoder, should be decided so that the known data place holder can be outputted from the output end of the data interleaver earlier than non-systematic parity place holder. In other words, when viewed from the output end of the data interleaver 107, the known data place holder that is used for initializing the trellis encoder may be outputted earlier than the RS parity place holder. However, the remaining known data place holder that is not used for the initialization of the trellis encoder may either be outputted later or be outputted earlier than the RS parity place holder. The place of the parity byte being outputted by the data interleaver 107 is decided in accordance with the Equation 1. And, as shown in Equation 1, the place of the non-systematic RS parity byte of each segment (or packet) is different from one another.

The output data of the RS encoder/parity place holder inserter 106 are provided to the data interleaver 107. Then, the data interleaver 107 interleaves and outputs the interleaved data. At this point, the data interleaver 107 receives a RS parity byte that is newly calculated and outputted by the non-systematic RS encoder 112 and, then, outputs the newly received RS parity byte instead of the non-systematic RS parity place holder. Each byte outputted from the data interleaver 107 is converted into 4 symbols by the byte-symbol converter 108 and then interleaved in the symbol domain. Thereafter, the converted symbols are inputted to the symbol processor 109. Herein, one symbol consists of 2 bits. Additionally, the known data generated (or created) from the known data generator 110 are also inputted to the symbol processor 109. Herein, the known data consist of the known data symbol generated from the symbol domain. This is because the known data are used in the symbol domain in the receiver. Also, in the transmitter, it is more efficient to create a known data symbol sequence having the desired characteristics in the symbol domain.

The symbol processor 109 receives the data outputted from the byte-symbol converter 108 and the known data symbol generated from the known data generator 110, processes the received data with a plurality of processing steps. Thereafter, the symbol processor 109 outputs the processed data to the trellis encoder 113. In other words, the symbol processor 109 receives the symbol configured of 2 bits. Then, the symbol processor 109 outputs processed symbol configured of 2 bits. In case of a main data symbol, the symbol processor 109 outputs the received symbol without any change in data. On the other hand, in case of an enhanced data symbol, the received symbol is processed with a signal process that can provide additional coding gain when used in connection with the trellis encoder 113. However, in the 207-byte enhanced data packet, the 3-byte MPEG header and known data byte and the 20-byte RS parity byte are processed as the main data symbol. Therefore, the bytes are directly outputted without any change in the data value(s).

As described above, having the 3-byte MPEG header and known data byte and the 20-byte RS parity byte be directly outputted from the symbol processor 109 without any change in data value, and having the corresponding bytes outputted from the output end of the data interleaver later than the non-systematic RS parity byte, since only the pre-decided values are used, do not affect the non-systematic RS-coding process. Accordingly, the degree of freedom in choosing the insertion position (or place) of the known data may be increased, thereby allowing a consecutive and long known data sequence to be inserted into the transmitted data.

Meanwhile, when the input data inputted to the symbol processor 109 correspond to the known data place holder that is converted to a symbol by the byte-symbol converter 108, the symbol processor 109 uses the known data generated from the known data generated 110 instead of the known data place holder. The symbol processor 109 then generates and outputs a data symbol at the beginning of the known data sequence so that the memory of the trellis encoder 113 is initialized to a pre-decided state. In order to do so, the memory value within the trellis encoder 113 should be inputted to the symbol processor 109.

Further, the memory value of the trellis encoder 113 may also be used in an additional signaling process for the enhanced data symbol. Additionally, the trellis encoder 113 is initialized at the beginning of the known data sequence because a plurality of output sequences may be generated depending upon the memory state of the trellis encoder 113 even when the known data sequence is inputted to the trellis encoder 113. Accordingly, the memory state of the trellis encoder 212 is first initialized to a pre-decided value and, then, when the known data are inputted, a desired known data output sequence may be obtained from the output of the trellis encoder 212.

In order to initialize the memory of the trellis encoder 113, two symbols are required. And, since the transmitter includes 12 trellis encoders, a total of 24 input symbols are used for the initialization process. More specifically, all of the 12 trellis encoders used in the broadcast system are identical to one another. Therefore, 12 identical symbol processors are also required in the structure. The output symbol of the symbol processor 109 is inputted to the trellis encoder 113 so as to be trellis-encoded.

The trellis encoder 113 pre-codes the data that are inputted as the upper bit among the output symbols of the symbol processor 109, and trellis-encodes the data that are inputted as the lower bit. Thereafter, the pre-coded data and the trellis-encoded data are outputted to the frame multiplexer 114. Meanwhile, the symbol processor 109 receives the 2-bit symbol, processes the received symbol with a plurality of process steps, and outputs the processed symbol. Therefore, the symbol should be converted back to bytes from the symbol-byte converter 111 so that the non-systematic RS encoder 112 can recalculate the RS parity from the output of the symbol processor 109. In other words, the symbol-byte converter 111 deinterleaves the input symbol in the symbol domain and converts the deinterleaved input symbol to byte units, which are then outputted to the non-systematic RS encoder 112. The non-systematic RS encoder 112 calculates the 20-byte RS parity for the data packet configured of 187 information bytes and outputs the calculated RS parity to the data interleaver 107. The data interleaver 107 receives the RS parity byte calculated and outputted from the non-systematic RS encoder 112 and replaces the non-systematic place holder that is not yet outputted with the received RS parity byte.

Herein, since the enhanced data symbol and the known data place holder are changed to different values by the symbol processor 109, a decoding error occurs when performing a RS decoding process in the conventional receiver. The non-systematic RS coding process is performed in order to prevent such decoding error from occurring. Meanwhile, the non-systematic RS encoder 112 receives the output of the known data generator 110 so that the symbol-byte converter 111 can receive in advance the known data being outputted later than the RS parity byte.

The frame multiplexer 114 inserts 4 segment synchronization symbols in every 828 output symbols of the trellis encoder 113, thereby configuring a data segment having 832 data symbols. More specifically, one field synchronization segment is inserted in each of the 312 data segments, so as to configure one data field, which is then outputted to the transmitter 120. The transmitter 120 inserts a pilot signal in the output of the frame multiplexer 114, the output having a segment synchronization signal and a field synchronization signal inserted therein. The transmitter 120 then modulates the pilot signal inserted data and converts the modulated data to an RF signal, which is transmitted through the antenna. Accordingly, the transmitter 120 includes a pilot inserter 121, a modulator 122, and a RF-UP converter 123. Furthermore, a pre-equalizer filter may be optionally included.

Figure 2B:
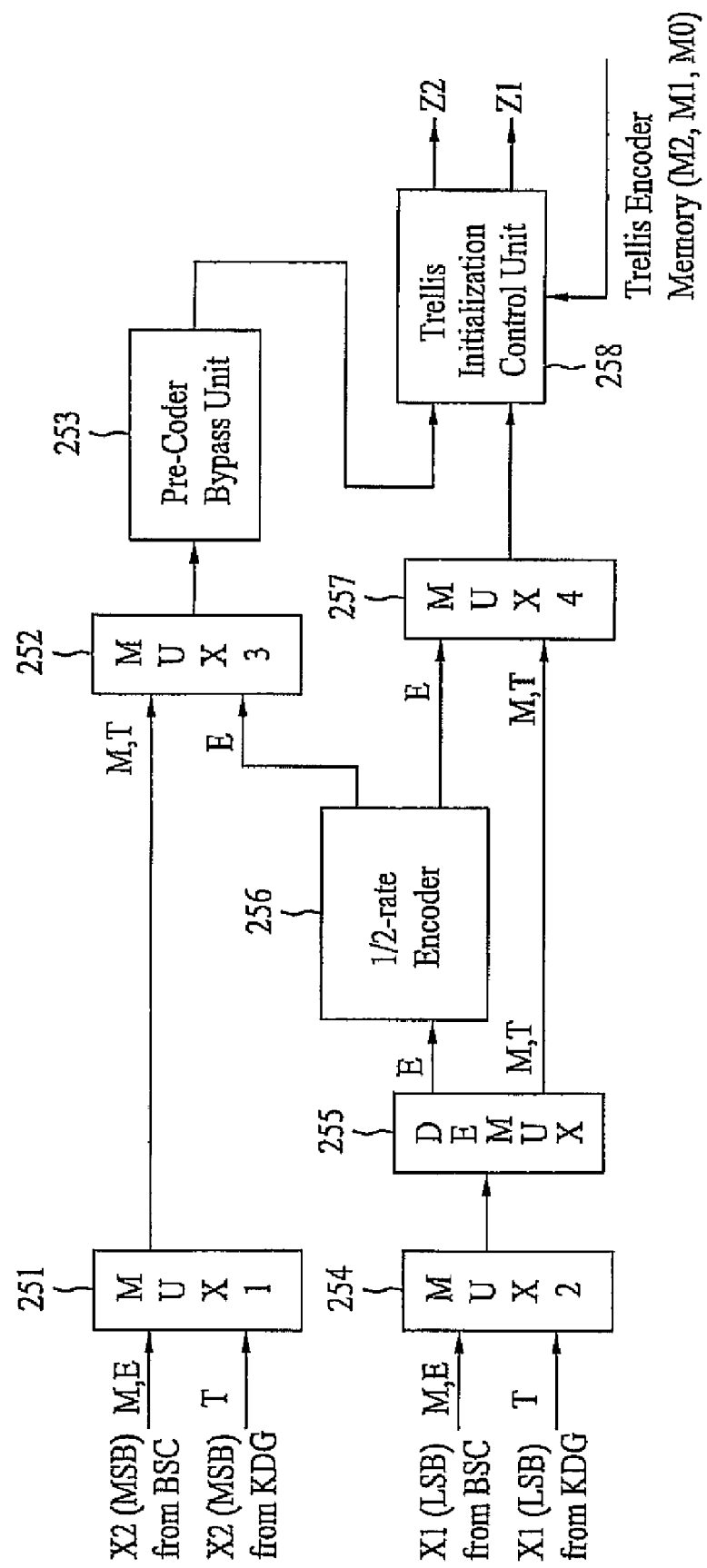
FIG. 2B illustrates a block diagram of a symbol processor according to another embodiment of the present invention.

FIG. 2A and FIG. 2B illustrate block diagrams of a symbol processor according to preferred embodiments of the present invention. For simplicity of the description, M represents the main data symbol, T signifies the known data symbol, and E represents the enhanced data symbol. Herein, X2 corresponds to the upper bit among the 2 bits of the input symbol, and X1 corresponds to the lower bit. At this point, if the MPEG header byte inserted to the enhanced data packet and the parity byte inserted by the RS encoder are converted to symbols, the inserted bytes are processed as the main data symbol.

The symbol processor of FIG. 2A includes first to fourth multiplexers 201, 206, 204, and 207, a demultiplexer 202, a ½-coding rate encoder (hereinafter referred to as a "½-rate encoder") 203, a pre-coder bypass 205, and a trellis initialization control unit 208. Referring to FIG. 2A, when the input symbol from the byte-symbol converter 108 is one of a main data symbol M and an enhanced data symbol E, the first multiplexer 201 selects an upper bit X2 of a symbol outputted from the byte-symbol converter 108. Alternatively, when the input symbol from the byte-symbol converter 108 is a known data symbol or a known data place holder symbol T, the first multiplexer 201 selects an upper bit X2 of a symbol outputted from the known data generator 110. Thereafter, the first multiplexer 201 outputs the selected upper bit X2 to the demultiplexer 202.

Additionally, when the input symbol from the byte-symbol converter 108 is one of a main data symbol M and an enhanced data symbol E, the second multiplexer 206 selects a lower bit X1 of the symbol outputted from the byte-symbol converter 108. And, when the input symbol from the byte-symbol converter 108 is a known data symbol or a known data place holder symbol T, the second multiplexer 206 selects a lower bit X1 of the symbol outputted from the known data generator 110. Thereafter, the second multiplexer 206 outputs the selected lower bit X1 to the fourth multiplexer 207. When the output bit outputted from the first multiplexer 201 is one of the upper bit of the main data symbol and the upper bit of the known data symbol, the demultiplexer 202 outputs the output bit to the third multiplexer 204. Alternatively, when the output bit is the upper bit of the enhanced data symbol, the demultiplexer 202 outputs the output bit to the ½-coding rate encoder (hereinafter referred to as "½-rate encoder") 203.

The ½-rate encoder 203 operates only on the enhanced data symbol, thereby coding the upper bit of the enhanced data symbol at a ½ coding rate and outputting two bits. At this point, among the output bits, one is outputted to the pre-coder bypass 205 through the third multiplexer 204, and the other is outputted to the fourth multiplexer 207. When the input symbol from the byte-symbol converter 108 is one of the main data symbol M and the known data symbol T, the third multiplexer 204 selects the output of the demultiplexer 202. And, when the input symbol from the byte-symbol converter 108 is the enhanced data symbol E, the third multiplexer 204 selects one output bit of the ½-rate encoder 203 and outputs the selected bit to the pre-coder bypass 205.

When the input data correspond to one of the enhanced data symbol, the pre-coder bypass 205 processes the input data, so that the pre-coder is bypassed in the trellis encoder 113 in a later process. Then the pre-coder bypass 205 outputs the processed data. When the input data correspond to the main data symbol or the known data symbol, the data are outputted without any change. The output of the pre-coder bypass 205 is then inputted to the trellis initialization control unit 208. The operation of the pre-coder bypass 205 will be described in detail in a later process.

When the input symbol from the byte-symbol converter 108 is the enhanced data symbol, the fourth multiplexer 207 selects the output bit of the ½-rate encoder 203 instead of the input bit from the second multiplexer 206 and outputs the selected output bit. When the input symbol from the byte-symbol converter 108 is one of the main data symbol and the known data symbol, the fourth multiplexer 207 selects the output bit of the second multiplexer 206 and outputs the selected output bit. Then, the selects bits are outputted to the trellis initialization control unit 208.

The trellis initialization control unit 208 generates data that enable the memory of the trellis encoder 113 to be initialized to a predetermined state, when the sequence of the known data symbol begins. Then, the trellis initialization control unit 208 outputs the generated data instead of the known data. Furthermore, in the remaining section, the input data are bypassed without modification. The operation of the trellis initialization control unit 208 will be described in detail in a later process. As a result, the symbol processor of FIG. 2A encodes the upper bit X2 among the two input bits of the enhanced data symbol and, then, outputs two bits. Herein, the lower bit X1 is discarded.

FIG. 2B illustrates a block diagram of a symbol processor according to another embodiment of the present invention. Herein, FIG. 2A and FIG. 2B are very similar to one another. However, the difference between the two symbol processors is that, in the one shown in FIG. 2B, the lower bit X1 among the two input bits of the enhanced data symbol is encoded, thereby outputting two bits, whereas the upper bit X2 is discarded. Referring to FIG. 2B, when the input symbol from the byte-symbol converter 108 is one of a main data symbol M and an enhanced data symbol E, the first multiplexer 251 selects an upper bit X2 of a symbol outputted from the byte-symbol converter 108. Alternatively, when the input symbol from the byte-symbol converter 108 is a known data place holder symbol (or a known data symbol) T, the first multiplexer 251 selects an upper bit X2 of a symbol outputted from the known data generator 110. Thereafter, the first multiplexer 251 outputs the selected upper bit X2 to the third multiplexer 252.

Additionally, when the input symbol from the byte-symbol converter 108 is one of a main data symbol M and an enhanced data symbol E, the second multiplexer 254 selects a lower bit X1 of the symbol outputted from the byte-symbol converter 108. And, when the input symbol from the byte-symbol converter 108 is a known data symbol T, the second multiplexer 254 selects a lower bit X1 of the symbol outputted from the known data generator 110. Thereafter, the second multiplexer 254 outputs the selected lower bit X1 to the demultiplexer 255. When the output bit of the second multiplexer 254 is the enhanced data, the demultiplexer 255 outputs the output bit to the ½-rate encoder 256. Alternatively, when the output bit of the second multiplexer 254 is the main data or the known data, the demultiplexer 255 outputs the output bit to the fourth multiplexer 257.

The ½-rate encoder 256 performs ½-rate coding on the enhanced data bit outputted from the demultiplexer 255, thereby generating 2 bits. Herein, one of the 2 bits is outputted to the third multiplexer 252, and the other bit is outputted to the fourth multiplexer 257. When the input data from the byte-symbol converter 108 is one of the main data and the known data, the third multiplexer 252 selects the output bit of the first multiplexer 251. And, when the input data from the byte-symbol converter 108 is the enhanced data, the third multiplexer 252 selects the output bit of the ½-rate encoder 256. Then, the third multiplexer 252 outputs the selected bit to the pre-coder bypass 253. When the input data correspond to the enhanced data, the pre-coder bypass 253 processes the input data so that the pre-coder is bypassed in the trellis encoder in a later process. Then, the pre-coder bypass 253 outputs the processed data. When the input data correspond to the main data or the known data, the data are outputted without any change. The output of the pre-coder bypass 253 is then inputted to the trellis initialization control unit 258.

When the input symbol from the byte-symbol converter 108 is the enhanced data symbol, the fourth multiplexer 257 selects and outputs the other output bit of the ½-rate encoder 256. When the input symbol from the byte-symbol converter 108 is the main data symbol or the known data symbol, the fourth multiplexer 257 selects the output bit of the demultiplexer 255 and outputs the selected bit to the trellis initialization control unit 258. The trellis initialization control unit 258 generates data that enable the memory of the trellis encoder 113 to be initialized to a predetermined state, when the sequence of the known data symbol begins. Then, the trellis initialization control unit 258 outputs the generated data instead of the known data. Furthermore, in the remaining section, the input data are bypassed without modification. As a result, the symbol processor of FIG. 2B encodes the lower bit X1 among the two input bits of the enhanced data symbol and, then, outputs two bits. Herein, the upper bit X2 is discarded.

Figure 3A:
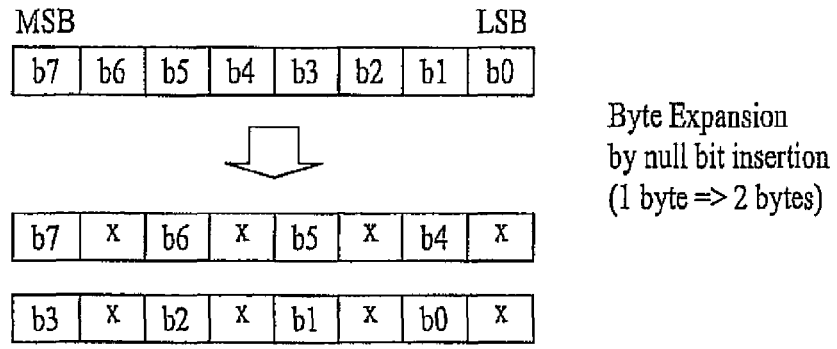
FIG. 3A to FIG. 3C illustrate examples of expanding one enhanced data byte to two bytes according to the present invention.
Figure 3B:
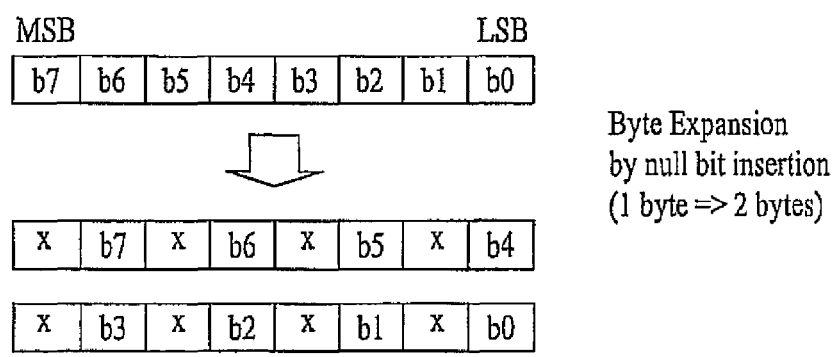
Figure 3C:
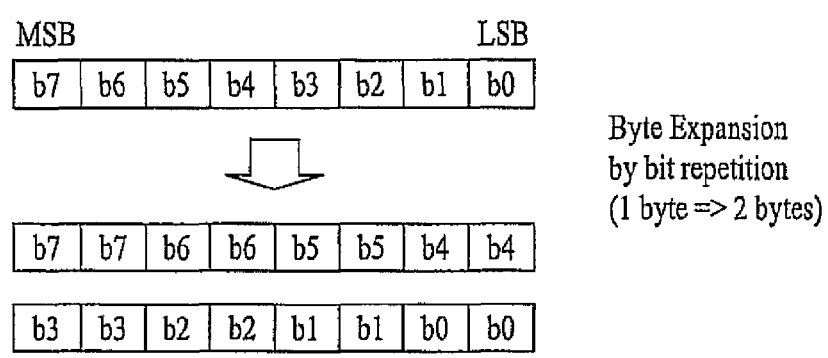
Figure 4A:
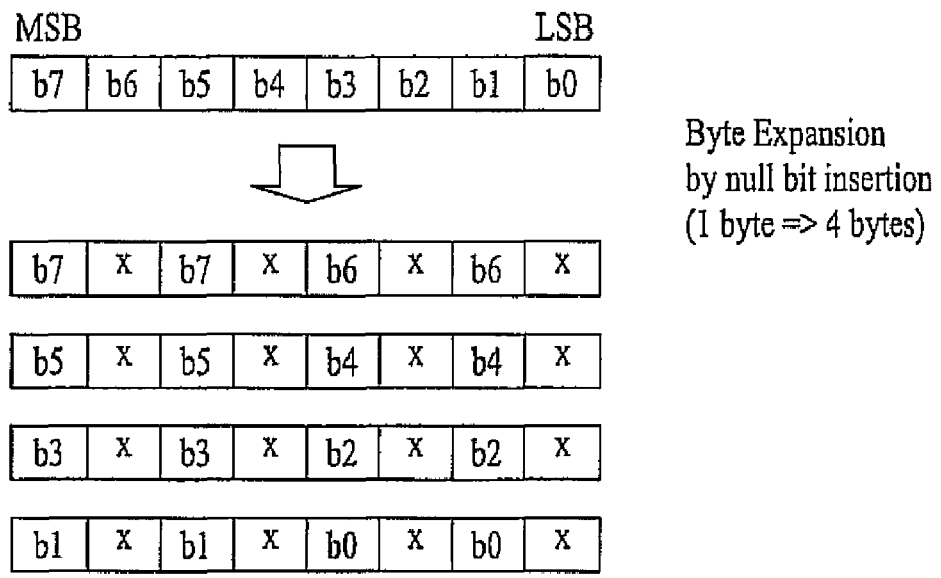
FIG. 4A to FIG. 4C illustrate examples of expanding one enhanced data byte to four bytes according to the present invention.
Figure 4B:
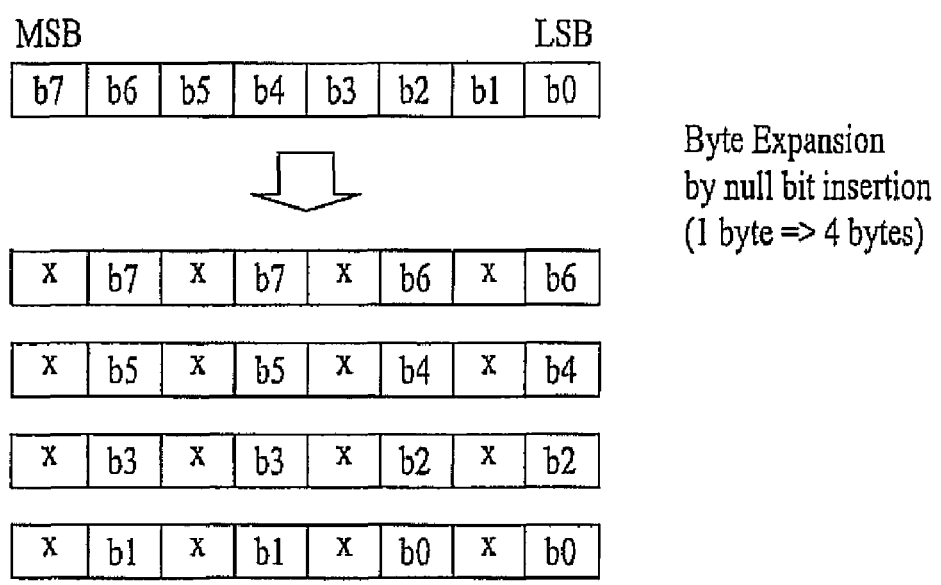
Figure 4C:
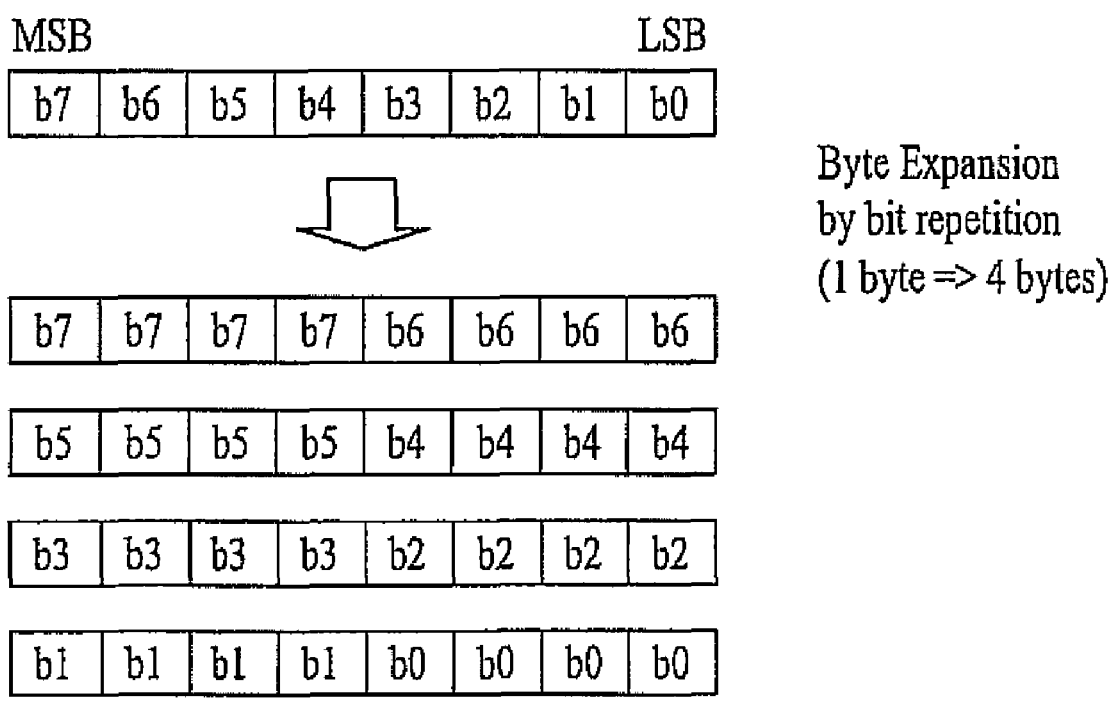

Meanwhile, the pre-processor 101 of FIG. 1 performs pre-processing steps such as additional error correction encoding, byte expansion, and so on, on the enhanced data. At this point, the processing method of the symbol processor may vary in accordance with the byte expansion method of the pre-processor 101. Examples of the same are shown in FIG. 3A to FIG. 3C and also in FIG. 4A to FIG. 4C. Herein, FIG. 3A to FIG. 3C illustrate examples of expanding one enhanced data byte to two bytes according to the present invention. And, FIG. 4A to FIG. 4C illustrate examples of expanding one enhanced data byte to four bytes according to the present invention. FIG. 3A and FIG. 4A are most effective when applied to the symbol processor of FIG. 2A. Alternatively, FIG. 3B and FIG. 4B are most effective when applied to the symbol processor of FIG. 2B. FIG. 3C and FIG. 4C may be applied in any one of FIG. 2A and FIG. 2B. The byte expansion includes the method of inserting null data bits between each bit and the method of repeating each bit.

FIG. 3A illustrates an example of the pre-processor 101 expanding one enhanced data byte to two bytes when using the symbol processor shown in FIG. 2A. In the symbol processor of FIG. 2A, only the upper bit of the enhanced data symbol is used and the lower bit is discarded. Therefore, as shown in FIG. 3A, the pre-processor 101 inserts a null data bit x after each bit for one input byte, thereby outputting two bytes. In a later process, the outputted bytes are converted to a 2-bit unit symbol by the byte-symbol converter and inputted to the symbol processor of FIG. 2A. At this point, the upper bit X2 of the input symbol includes information, and the lower bit X1 is a null data bit. Herein, the lower bit X1 is replaced with the output bit of the ½-rate encoder 203 by the fourth multiplexer 207 of FIG. 2A.

FIG. 3B illustrates an example of the pre-processor 101 expanding one enhanced data byte to two bytes when using the symbol processor shown in FIG. 2B. In the symbol processor of FIG. 2B, only the lower bit of the enhanced data symbol is used and the upper bit is discarded. Therefore, as shown in FIG. 3B, the pre-processor 101 inserts a null data bit x before each bit for one input byte, thereby outputting two bytes. In a later process, the outputted bytes are converted to a 2-bit unit symbol by the byte-symbol converter and inputted to the symbol processor of FIG. 2B. At this point, the upper bit X2 is a null data bit, and the lower bit X1 of the input symbol includes information. Herein, the upper bit X2 is replaced with the output bit of the ½-rate encoder 256 by the third multiplexer 252 of FIG. 2B.

FIG. 3C illustrates yet another example of expanding one enhanced data byte to two bytes that can be applied to the symbol processor of both FIG. 2A and FIG. 2B. The null data bit shown in FIG. 3A and FIG. 3B may be given an arbitrary value. Therefore, as shown in FIG. 3C, each bit for one input byte is repeated one time to be expanded to 2 bytes. This expansion method can be applied to the symbol processor of both FIG. 2A and FIG. 2B.

FIG. 4A illustrates an example of the pre-processor 101 expanding one enhanced data byte to four bytes when using the symbol processor shown in FIG. 4A. In the symbol processor of FIG. 2A, only the upper bit of the enhanced data symbol is used and the lower bit is discarded. Therefore, as shown in FIG. 4A, the pre-processor 101 repeats each bit for one input byte so as to create 2 bits. Then, the pre-processor 101 inserts a null data bit x after each bit including the repeated bits, thereby outputting four bytes. More specifically, the amount of data in the enhanced data is expanded to 4 times its initial size. The outputted bytes are converted to a 2-bit unit symbol by the byte-symbol converter and inputted to the symbol processor of FIG. 2A. At this point, the upper bit X2 of the input symbol includes information, and the lower bit X1 is a null data bit. Herein, the lower bit X1 is replaced with the output bit of the ½-rate encoder 203 by the fourth multiplexer 207 of FIG. 2A.

FIG. 4B illustrates an example of the pre-processor 101 expanding one enhanced data byte to four bytes when using the symbol processor shown in FIG. 2B. In the symbol processor of FIG. 2B, only the lower bit of the enhanced data symbol is used and the upper bit is discarded. Therefore, as shown in FIG. 4B, the pre-processor 101 repeats each bit for one input byte so as to create 2 bits. Then, the pre-processor 101 inserts a null data bit x before each bit including the repeated bits, thereby outputting four bytes. The outputted bytes are converted to a 2-bit unit symbol by the byte-symbol converter and inputted to the symbol processor of FIG. 2B. At this point, the lower bit X1 of the input symbol includes information, and the upper bit X2 is a null data bit. Herein, the upper bit X2 is replaced with the output bit of the ½-rate encoder 256 by the third multiplexer 252 of FIG. 2B.

FIG. 4C illustrates yet another example of expanding one enhanced data byte to four bytes that can be applied to the symbol processor of both FIG. 2A and FIG. 2B. The null data bit shown in FIG. 4A and FIG. 4B may be given an arbitrary value. Therefore, as shown in FIG. 4C, each bit for one input byte is repeated four times to be expanded to 2 bytes. This expansion method can be applied to the symbol processor of both FIG. 2A and FIG. 2B. By expanding the data byte as shown in FIG. 4A to FIG. 4C, each bit is coded with a ½-coding rate twice by the symbol processor, which results in a coding rate of ¼ (hereinafter referred to as a ¼-coding rate) of the bits.

Figure 5:
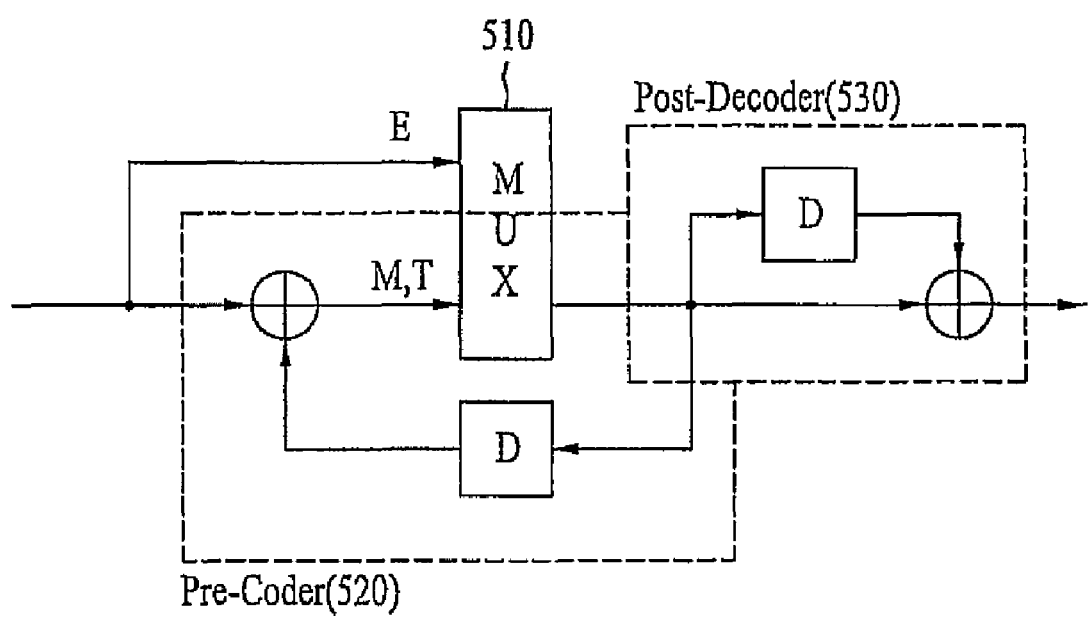
FIG. 5 illustrates a block diagram of a pre-coder bypass according to an embodiment of the present invention.

FIG. 5 illustrates a block diagram of the pre-coder bypass 205 or 253 included in the symbol processor. Referring to FIG. 5, the pre-coder bypass according to the present invention includes a multiplexer 510, a pre-coder 520, and a post-decoder 530. Herein, the post-decoder 530 performs an inverse process of the pre-coder 520. The multiplexer 510 selects either an input bit or an output bit of the pre-coder 520 in accordance with the input data symbol type. Then, the multiplexer 510 outputs the selected input bit or output bit to the post-decoder 530. If the input data is an enhanced data symbol, the multiplexer 510 selects the input bit. Conversely, if the input data is a main data symbol or a known data symbol, the multiplexer 510 selects the output bit of the pre-coder 52D. Thereafter, the selected bit is outputted to the post-decoder 530. Accordingly, the post-decoder 530 post-decodes and outputs the output of the multiplexer 510.

If a main data symbol or a known data symbol is inputted to the pre-coder bypass of FIG. 5, the inputted main data symbol or known data symbol sequentially passes through the pre-coder 520 and the post-decoder 530. Therefore, a value equal to that of the input bit is outputted. Accordingly, when the main data pass through the pre-coder included in the trellis encoder, the main data and/or the known data are pre-coded. Meanwhile, when the enhanced data symbol is inputted, the input symbol only passes through the post-decoder 530. This indicates that when the symbol passes though the pre-coder of the trellis encoder, the enhanced data symbol bypasses the pre-coder.

Figures 6A, 6B:
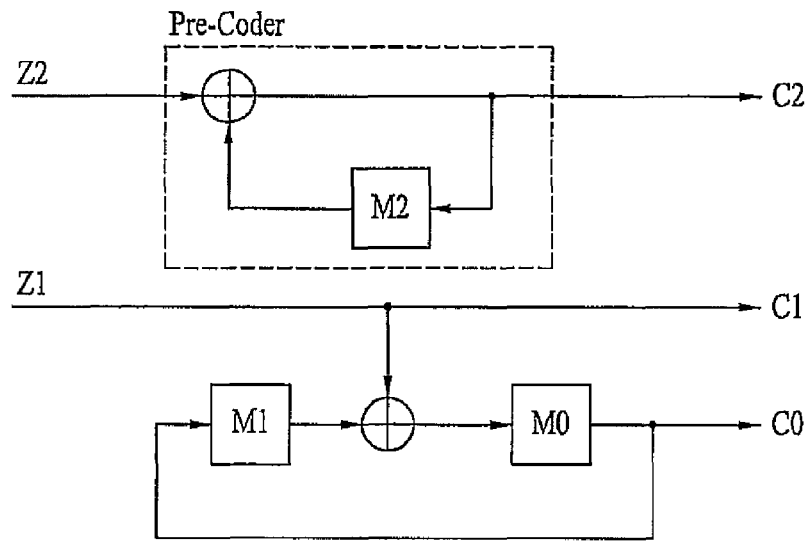
FIG. 6A illustrates a block diagram of a trellis encoder according to an embodiment of the present invention.
FIG. 6B illustrates an example of an input symbol for initializing a memory of the trellis encoder according to the present invention.

FIG. 6A illustrates a detailed block diagram of the trellis encoder 113. Herein, two input bits Z1 and Z2 are coded so as to output three bits C0 to C2. The upper bit Z2 of the input bit uses a memory M2 so as to be pre-coded and outputted as C2. Alternatively, the lower bit Z1 of the input bit uses the memories M0 and M1, so as to be trellis-encoded and outputted as C0 and C1, respectively. The output C2C1C0 of the trellis encoder 113 is mapped to an B-level signal and outputted. More specifically, the trellis encoder 113 pre-codes the upper bit Z2 of the output symbol outputted from the symbol processor 109, and outputs the pre-coded upper bit as C2. Furthermore, the trellis encoder 113 trellis-encodes the lower bit Z1 and outputs the trellis-encoded lower bit as C1 and C0.

Therefore, the memory M2 of the trellis encoder 113 is decided only by Z2, and the memories M1 and M0 are decided only by Z1.

As shown in FIG. 6A, one Z2 is required to initialize the memory M2 of the trellis encoder to a specific value, and two Z1 are required to initialize each of the memories M1 and M0 to a specific value. Therefore, in order to initialize the memories M2, M1, and M0 of the trellis encoder, at least two input symbols are required. FIG. 6B describes a process of inputting two symbols required for initializing an arbitrary memory state M2M1M0 to '000'. For example, when the state of the memory MM21M0 is equal to '111' (i.e., when M2M1M0=111), in order to initialize the memory M2M1M0 to '000', the input bits Z2Z1 should be consecutively inputted as '01' and '11' or as '11' and '01'.

The trellis initialization control unit of the symbol processor receives the memory value of the trellis encoder and, then, uses the table shown in FIG. 6B so as to output the input symbol sequence required for the initializing process. If the memory state of the trellis encoder that is to be initialized is not equal to '000', two symbol sequences different from the ones shown in FIG. GB are required. However, since such sequences may be easily deduced, a detailed description of such process will be omitted for simplicity.

As described above, the trellis initialization control unit generates data so that a memory may be initialized to a pre-decided state in accordance with the memory state of the trellis encoder during the first two symbol periods at the beginning of the known data symbol sequence. Subsequently, the trellis initialization control unit outputs the newly generated initialization data instead of the input data. Thereafter, during the remaining symbol periods, the input data are outputted without modification. The memory of the trellis encoder is initialized so that the known data may be maintained as the known data even after being trellis-encoded. Evidently, the known data symbol being outputted from the trellis encoder is different from the known data symbol being inputted to the trellis encoder.

Figure 7A:
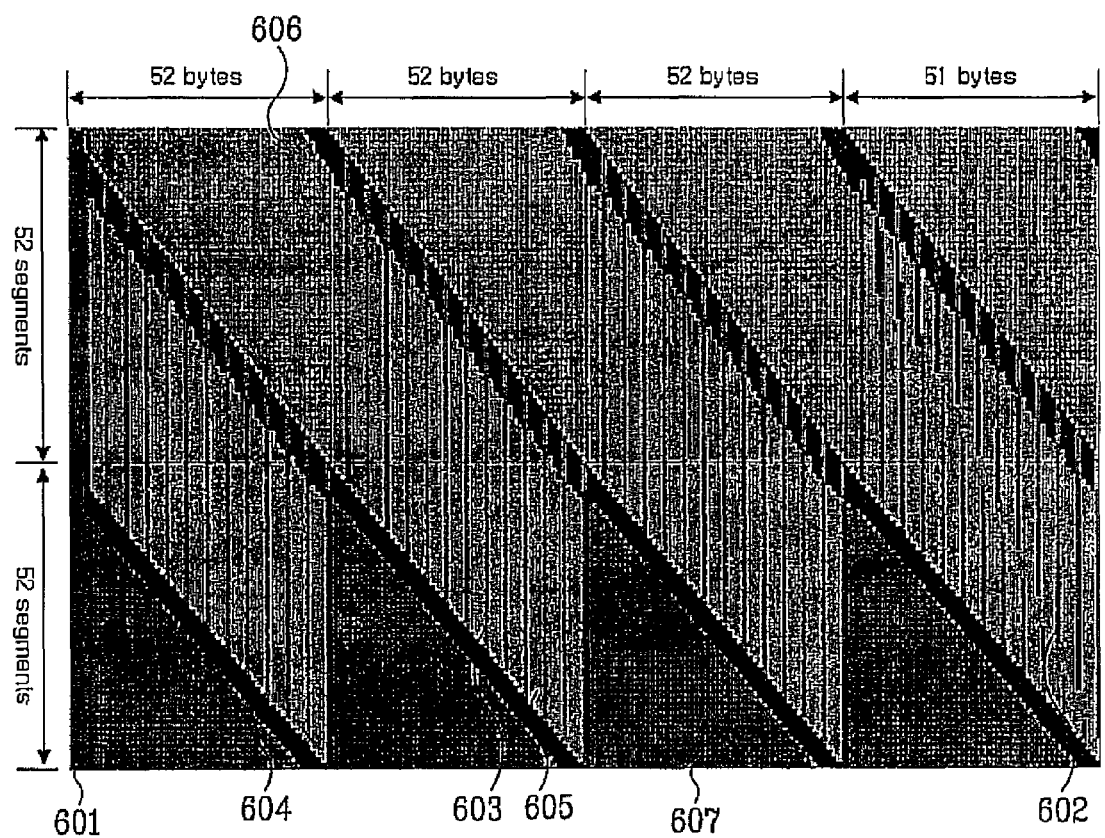
Figure 7B:
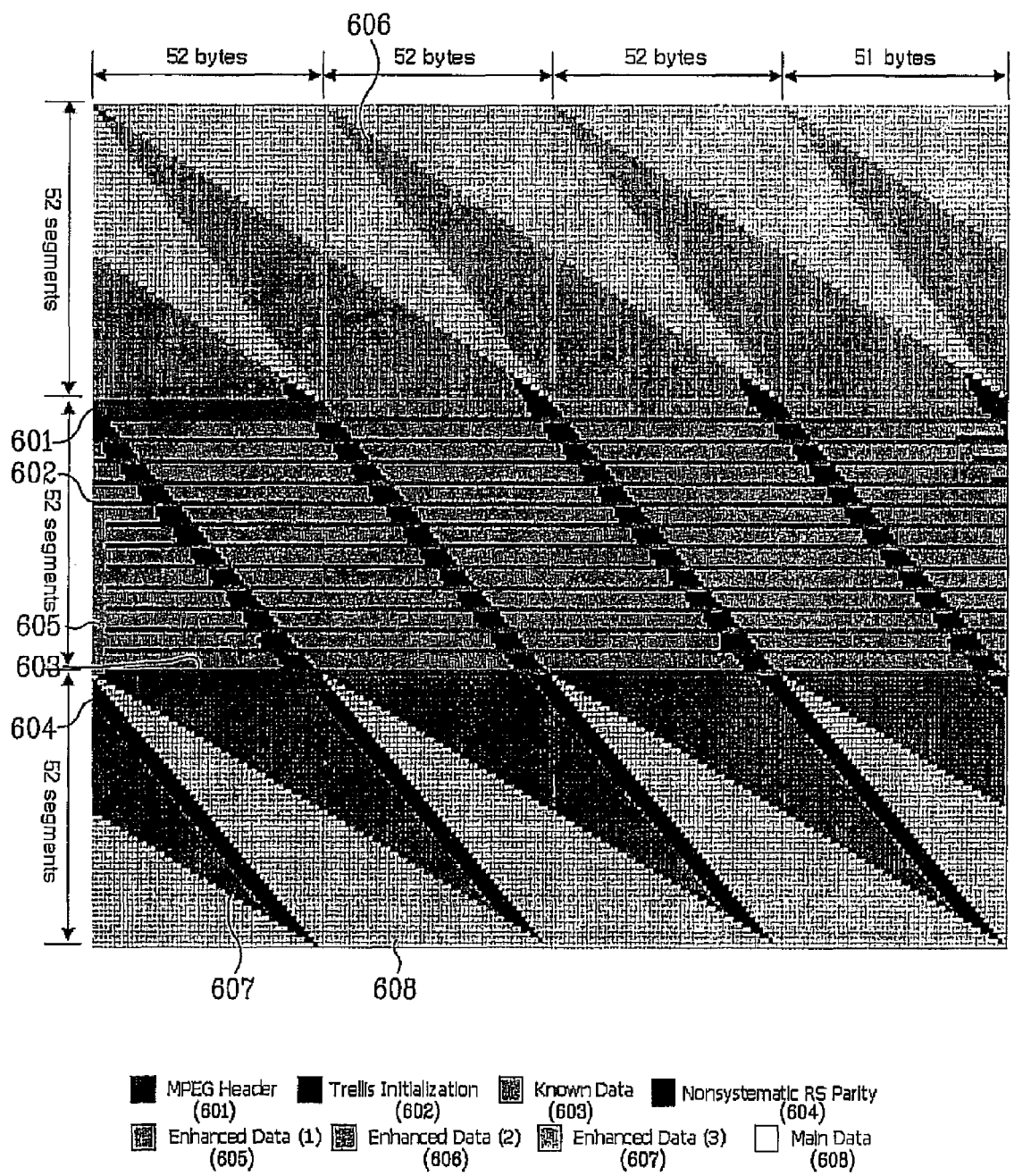

FIG. 7A to FIG. 7C illustrate exemplary configurations of an enhanced data packet group having known data inserted therein according to a first embodiment of the present invention. More specifically, FIG. 7A illustrates a data configuration at an input end of the data interleaver 107. FIG. 7B illustrates a data configuration at an output end of the data interleaver 107. And, FIG. 7C illustrates an example of the output bits of the data interleaver 107 being converted to a symbol from bytes by the byte-symbol converter 108, which is then interleaved in the symbol domain and outputted.

Referring to FIG. 7A, one square unit represents one byte. And, one row represents one enhanced data packet being configured of 207 bytes. Accordingly, a series of 104 consecutive enhanced data packets represents one enhanced data packet group. As shown in FIG. 7A, the 601 area indicates the 3-byte MPEG transport header bytes excluding the 0x47 synchronization byte, which has been inserted by the packet formatter 102. The 603 area signifies the known data place holder bytes inserted by the packet formatter 102. The 604 area represents the non-systematic RS parity place holder inserted from the RS encoder/non-systematic RS parity place holder inserter 106. And, the 605 area indicates the enhanced data, and the 602 area signifies the known data place holder byte which is to be used for the initialization of the trellis encoder. Meanwhile, referring to FIG. 7A, both the 606 area and the 607 area represent the enhanced data. At this point, the enhanced data of the 606 area are outputted by having the corresponding enhanced data interleaved with the main data placed before the enhanced data packet group and then outputted. On the other hand, the enhanced data of the 607 area are outputted by having the corresponding enhanced data interleaved with the main data placed after the enhanced data packet group and then outputted.

Once the data interleaver 107 interleaves the enhanced data packet group of FIG. 7A, the interleaved enhanced data packet group is outputted as shown in FIG. 7B. Referring to FIG. 7B, the 608 area represents the main data bytes positioned before and after the enhanced data packet group. FIG. 7B shows the data bytes of the enhanced data packet group and the main data bytes being mixed after the interleaving process. As shown in FIG. 7B, in the enhanced data packet group according to the first embodiment of the present invention, a known data sequence is outputted from the output end of the data interleaver 107 in accordance with a regular cycle.

Meanwhile, FIG. 7C illustrates a data output in which the area corresponding to the intermediate 52 packets shown in FIG. 7B is sequentially processed through the byte-symbol converter 108, the symbol processor 109, the trellis encoder 113, and the frame multiplexer 114. Herein, the data configuration corresponds to the symbol domain. Referring to FIG. 7C, one small square represents one symbol. And, one row represents a data segment configured of 4 segment synchronization symbols and 828 (i.e., 207×4) data symbols. The output of the data interleaver 107 is converted to symbols from bytes by the byte-symbol converter 108, and the converted symbols are then interleaved in the symbol domain and then outputted. Subsequently, the symbols are processed through the symbol processor 109 and the trellis encoder 113, thereby being inputted to the frame multiplexer 114. The frame multiplexer 114 adds 4 segment synchronization symbols after each set of 828 symbols, thereby configuring a data segment having 832 symbols.

Referring to FIG. 7B, the 12 data bytes corresponding to the 602 area, which are positioned in front of each known data byte sequence, are used for initializing the trellis encoder. The 12 data bytes are converted to 48 symbols by the byte-symbol converter 108 and are, then, outputted as shown in FIG. 3. Herein, only 2 symbols are required for initializing a trellis encoder. And, since 12 trellis encoders are included in the present invention, only the first 2 symbols for each of the 12 trellis encoders (i.e., a total of 24 symbols) among the 48 symbols are used for initializing the trellis encoders. Therefore, the remaining 24 symbols may be used as known data symbols.

As shown in FIG. 7C, the MPEG header symbols and the RS parity symbols are all assumed to have the characteristics of a main data symbol by the symbol processor 109. And, the symbol processor 109 processes the symbols of 601 and 604 domain accordingly. Accordingly, the symbol processor 109 directly outputs the MPEG header symbols and the RS parity symbols without any data modification. The known data place holder symbol that is outputted from the byte-symbol converter 108 is replaced with the data generated from the known data generator 110, the generated data being directly outputted without any data modification. Conversely, the symbol processor 109 modifies the values of the enhanced data symbols and the known data symbols that are used for initializing the trellis encoders, which are then outputted. Therefore, the enhanced data bytes and the known data place holder bytes, which are used in the initialization of the trellis encoders, should all be outputted from the output end of the data interleaver 107 earlier than RS parity bytes.

Meanwhile, referring to FIG. 7C, the 609 area lined bold corresponds to an area wherein a known data symbol sequence having the same pattern is repeatedly inserted at regular intervals. Herein, it is preferable that the interval at which the known data symbol sequence is being inserted is a multiple of the segment length. This is to allow the segment synchronization symbols inserted by the frame multiplexer 114 to be inserted at regular positions within the known data sequence where the segment synchronization symbols are used as a portion of the known data sequence. Although FIG. 7A to FIG. 7C illustrate examples in which 104 enhanced data packets configure one group, an arbitrary number may be decided as the number of enhanced data packets configuring the data packet group. However, since the data interleaver 107 interleaves data by 52 packet units, it is preferable to decide the number of enhanced data packets to be a multiple of the 52 packets. In the example shown in FIG. 7C, the known data symbol sequence is repeatedly inserted at an interval of 4 data segments.

Figure 8A:
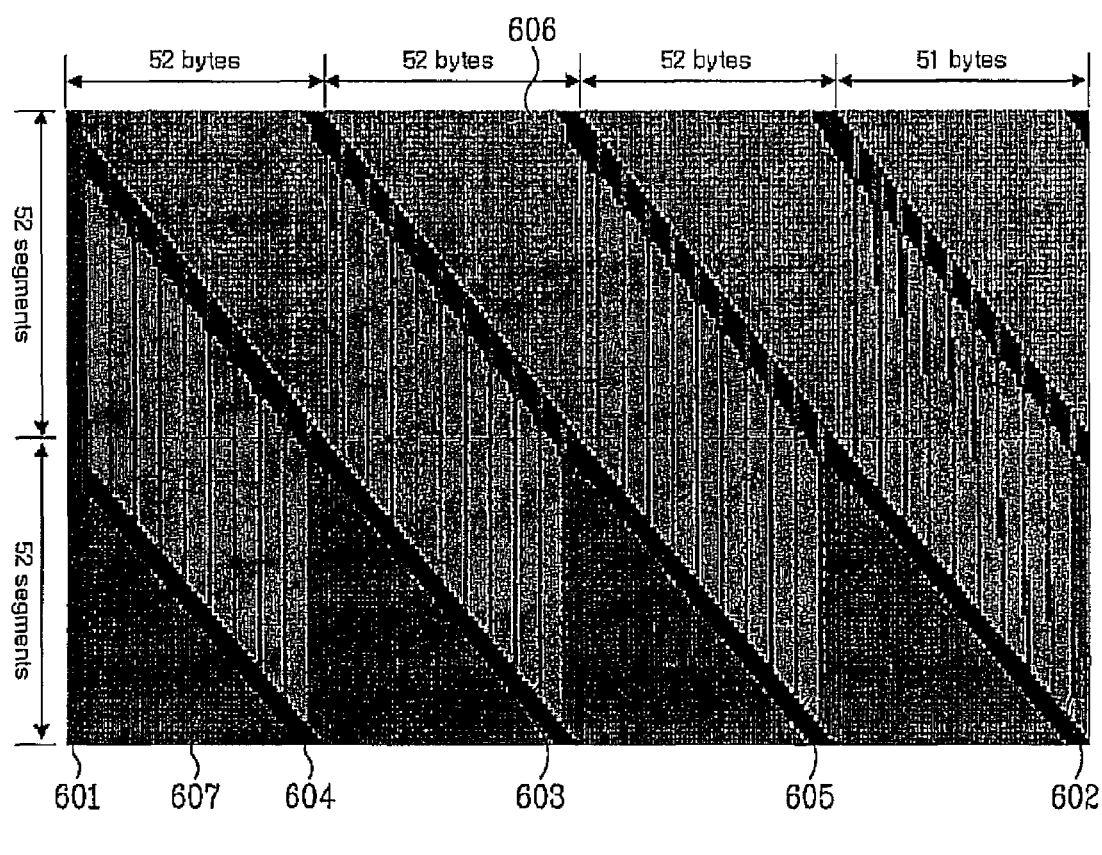
FIG. 8A to FIG. 8C illustrate exemplary configurations of an enhanced data packet group having known data inserted therein according to a second embodiment of the present invention.
Figure 8B:
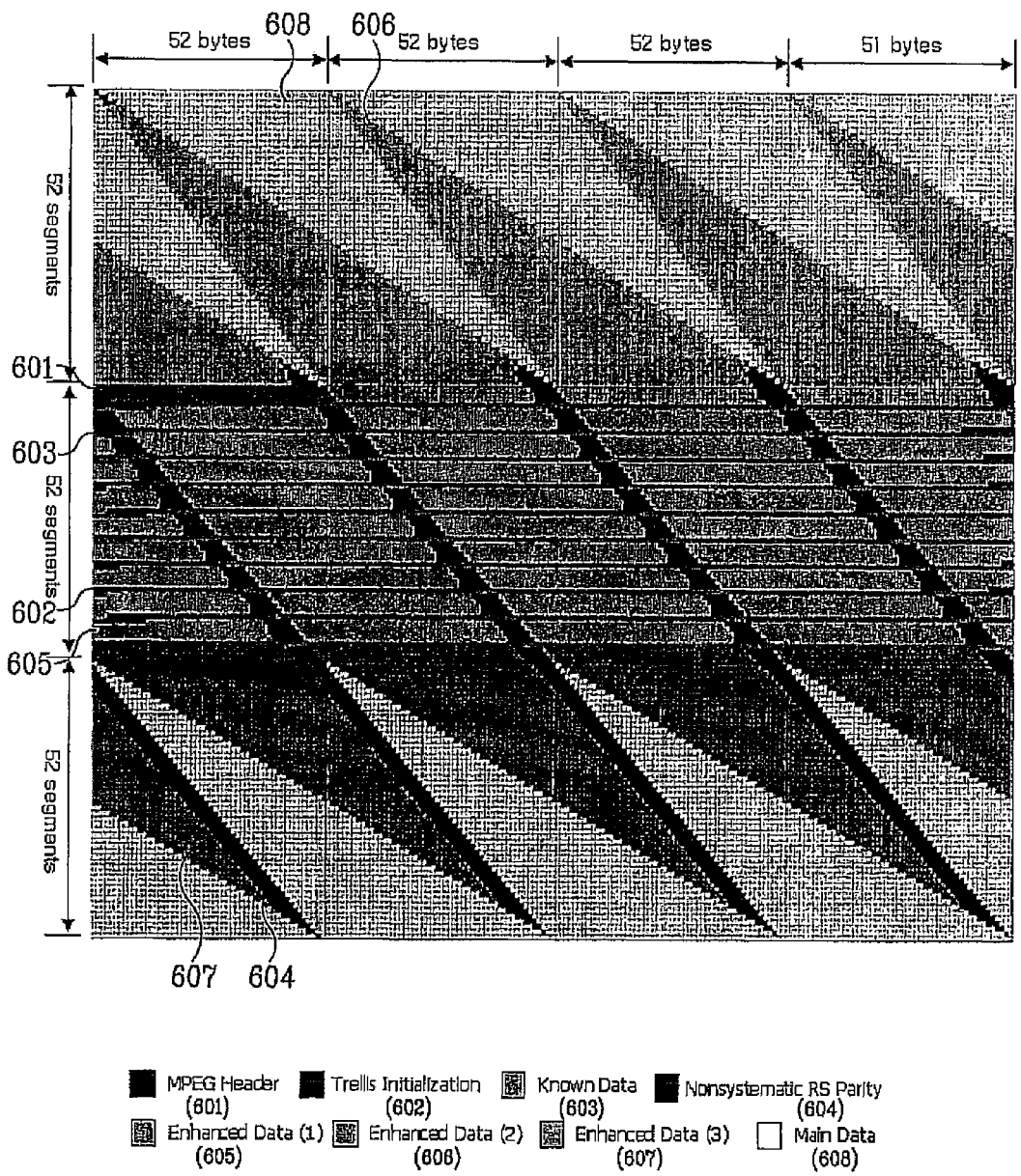
Figure 8C:
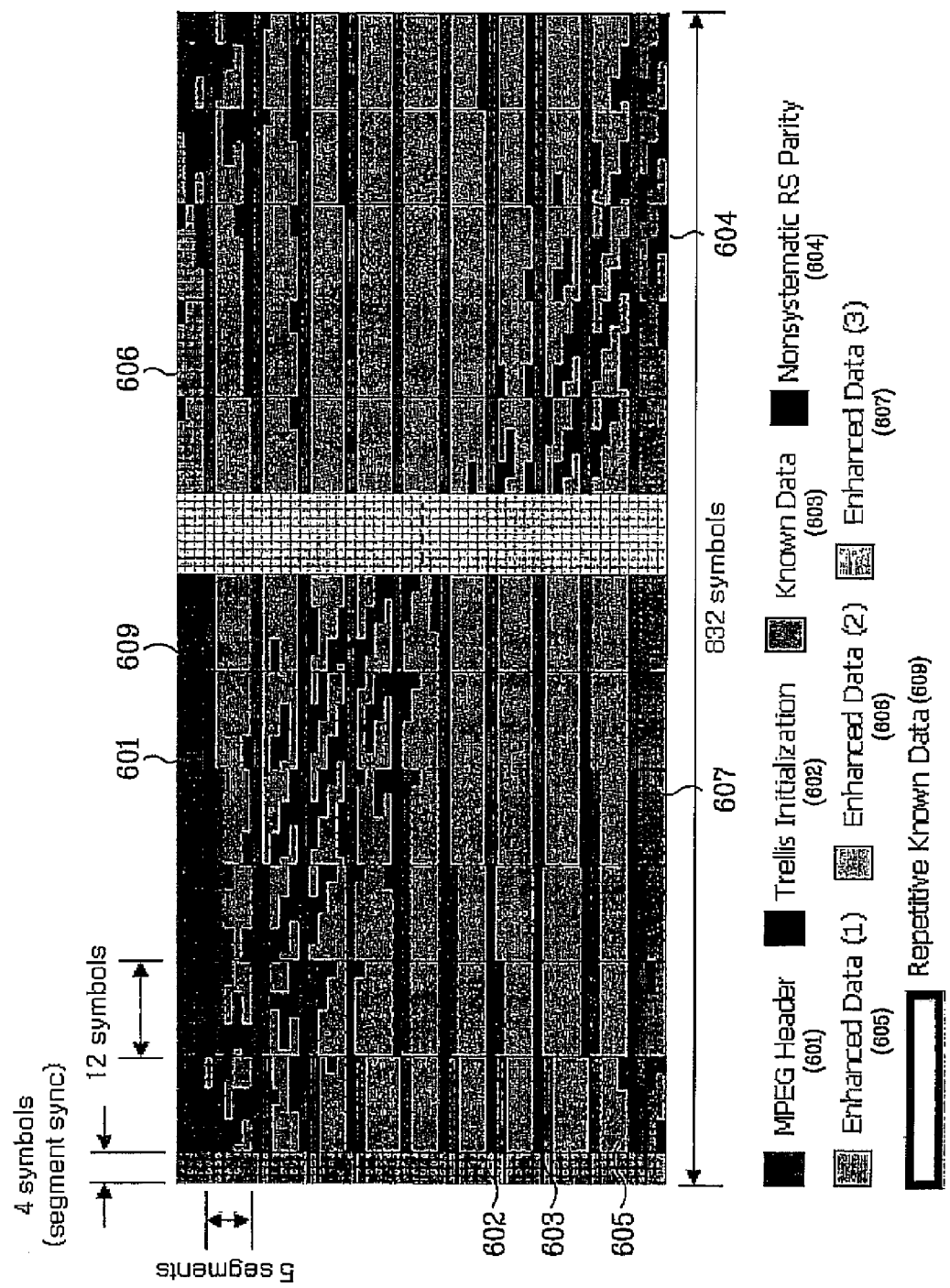
Figure 9A:
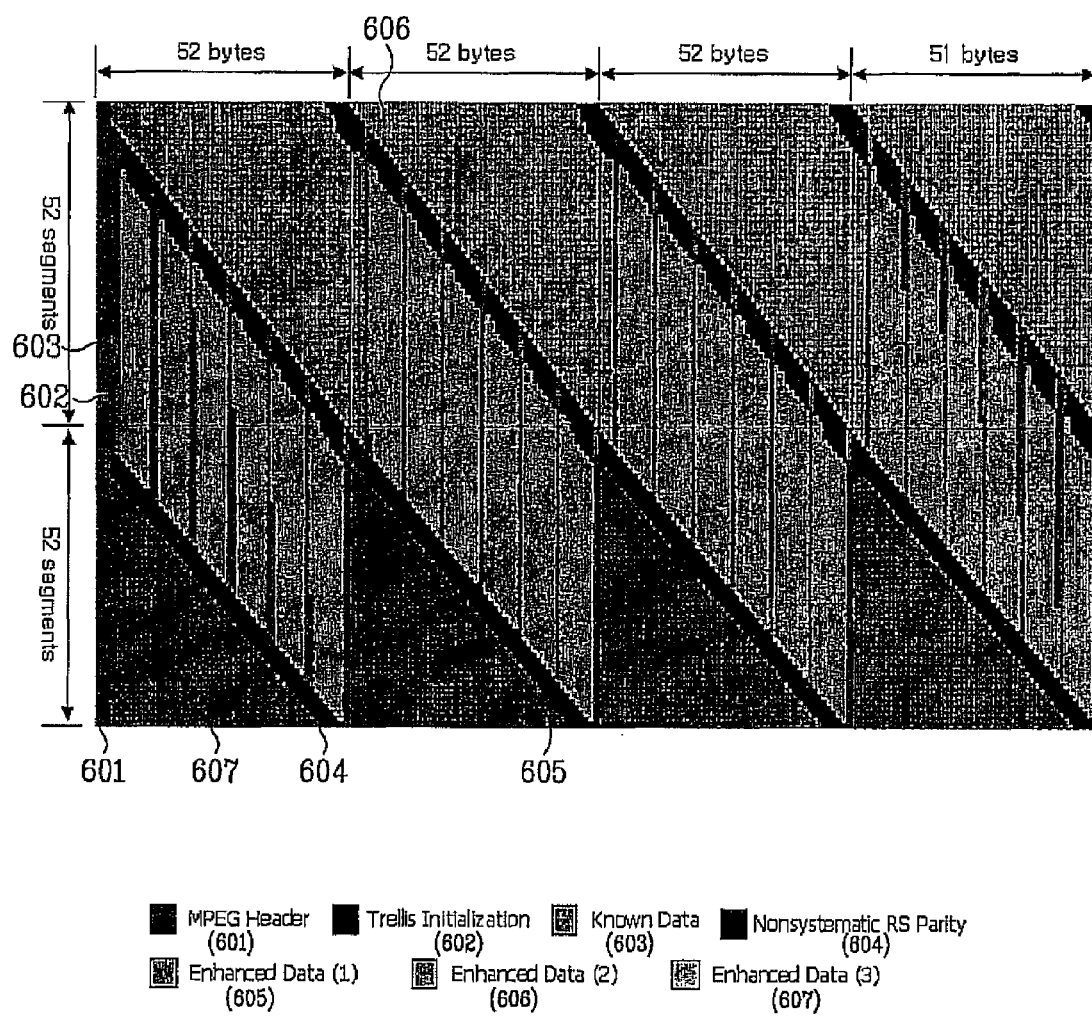
FIG. 9A to FIG. 9C illustrate exemplary configurations of an enhanced data packet group having known data inserted therein according to a third embodiment of the present invention.
Figure 9B:
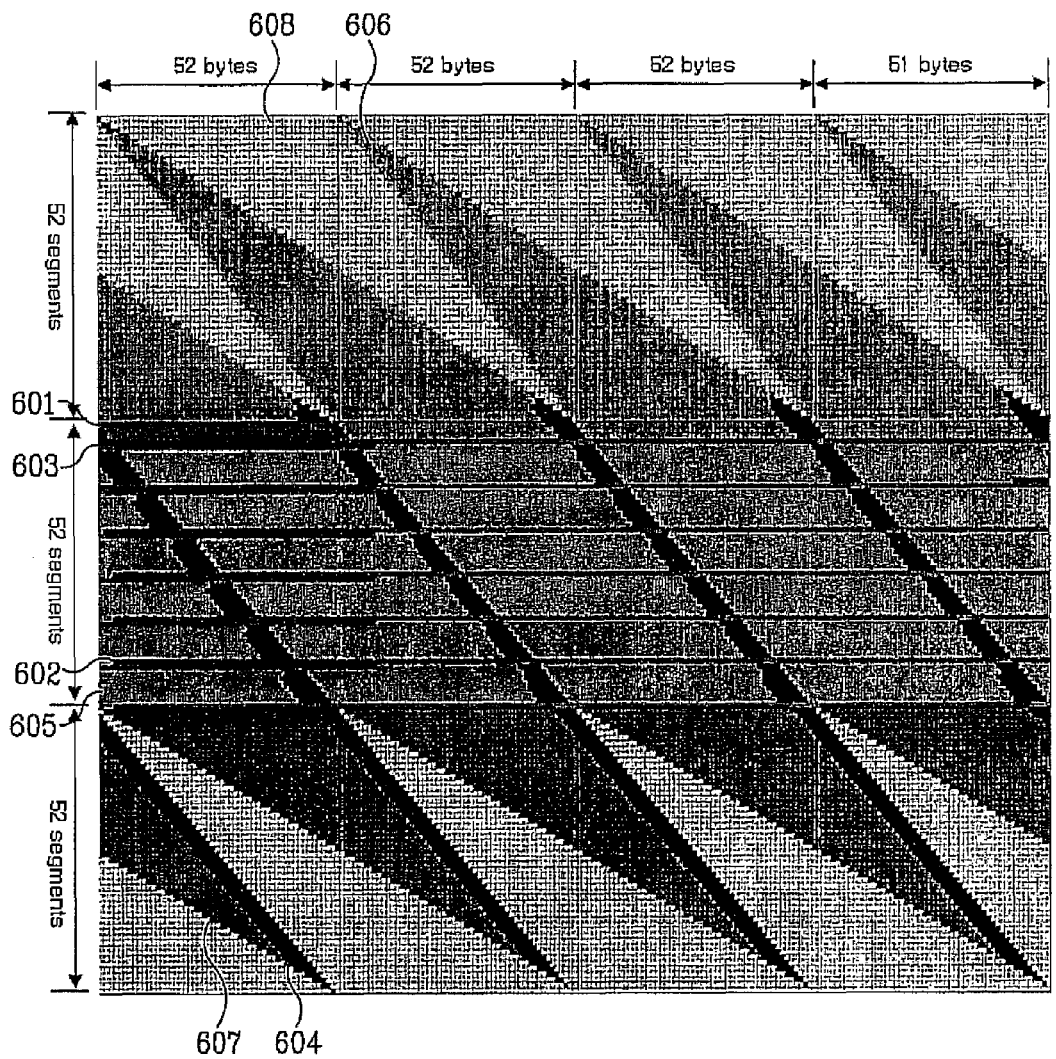
Figure 9C:
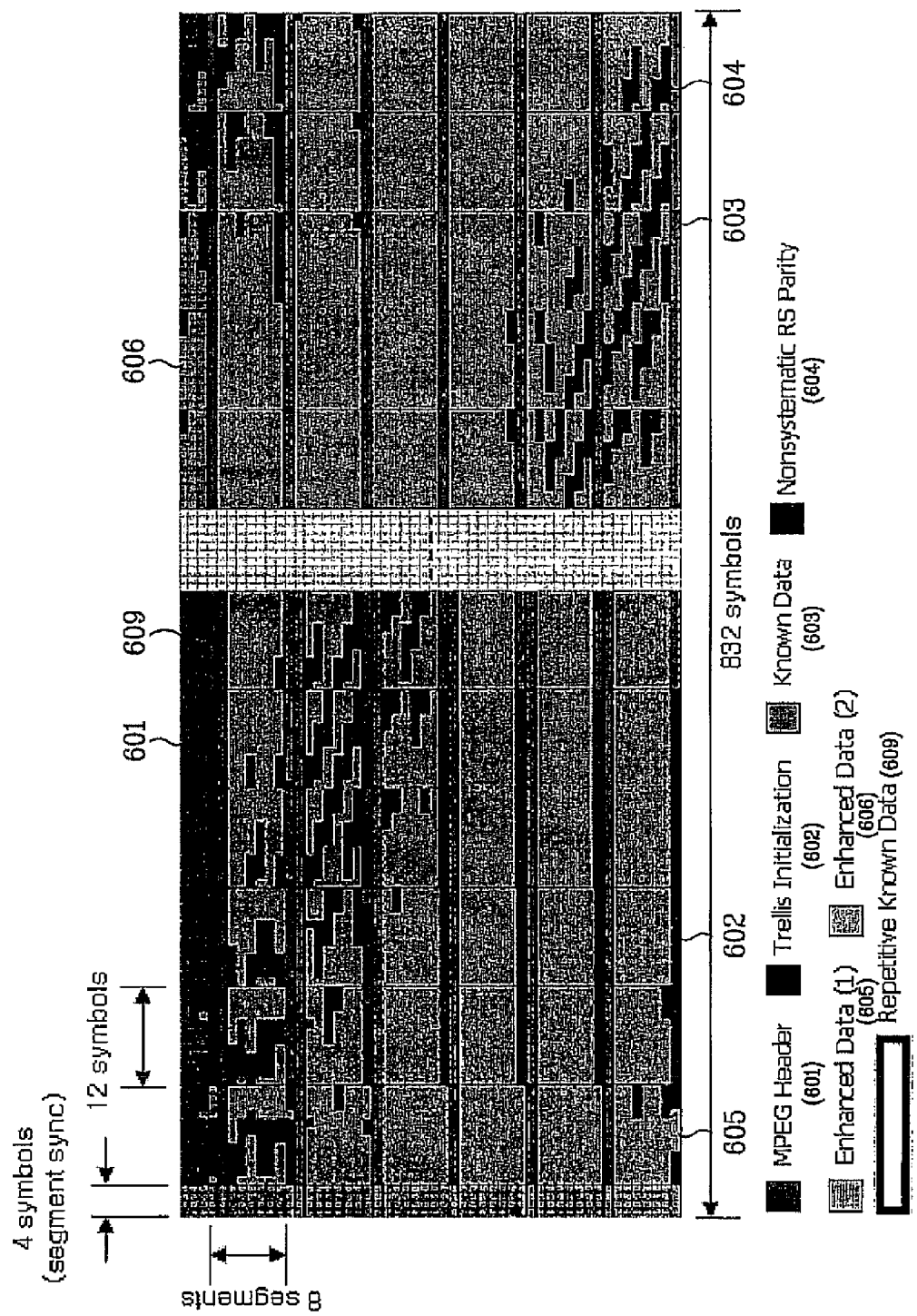

FIG. 8A to FIG. 8C illustrate exemplary configurations of an enhanced data packet group having known data inserted therein according to a second embodiment of the present invention. Herein, the known data symbol sequence is repeatedly inserted at an interval of 5 data segments. And, FIG. 9A to FIG. 9C illustrate exemplary configurations of an enhanced data packet group having known data inserted therein according to a third embodiment of the present invention. Herein, the known data symbol sequence is repeatedly inserted at an interval of 8 data segments.

Figure 10:
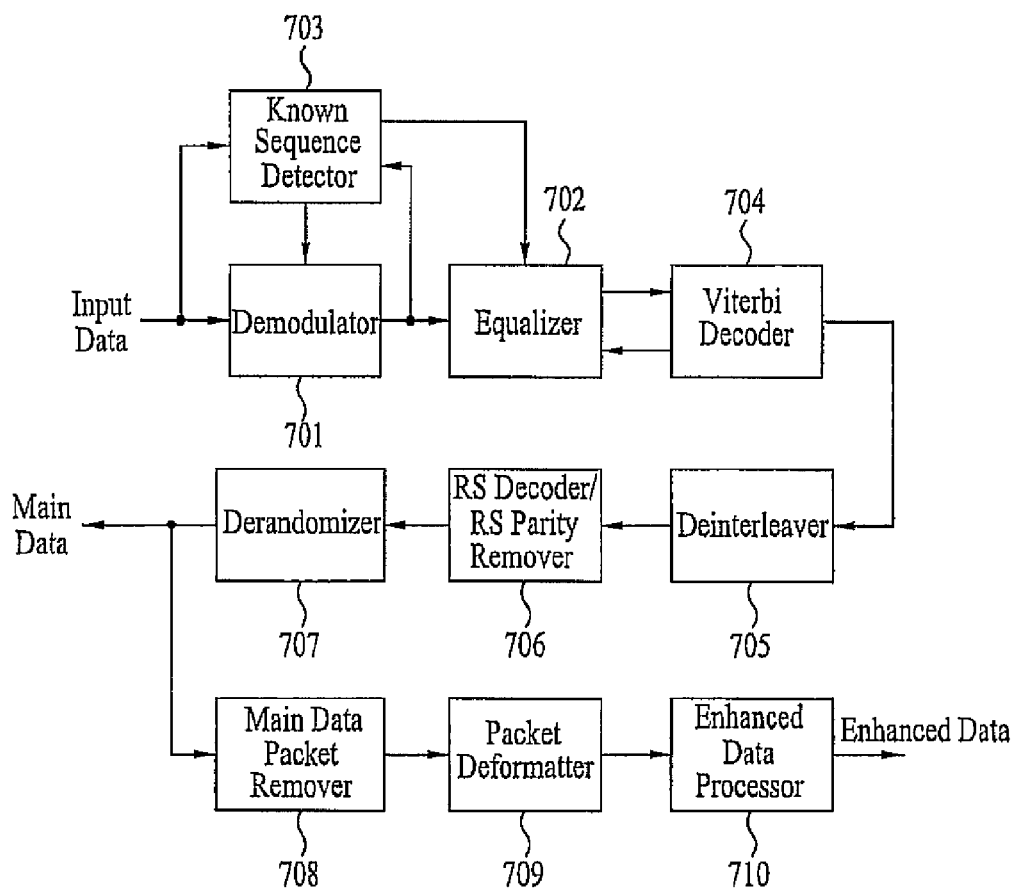
FIG. 10 illustrates a block diagram showing a general structure of a demodulating unit within a digital broadcast (or television or DTV) receiver according to an embodiment of the present invention.

FIG. 10 illustrates a block diagram showing the structure of a demodulating unit within a digital broadcast receiver that receives and processes enhanced data and known data that are multiplexed and transmitted. The demodulating unit may be applied to digital broadcast transmitter shown in FIG. 1. Furthermore, since any type of demodulating unit that can demodulate enhanced data may be applied to the present invention, the present invention is not limited to the examples set forth herein. In other words, the demodulating unit shown in FIG. 10 is merely an example introduced for a better understanding of the present invention.

The demodulating unit uses the known data information inserted in an enhanced data section and transmitted by the transmitter, so as to recovery the carrier synchronization, recovery the frame synchronization, and perform channel equalization, thereby enhancing the receiving performance of the present invention.

Referring to FIG. 10, the demodulating unit includes a demodulator 701, an equalizer 702, a known sequence detector 703, a Viterbi decoder 704, a data deinterleaver 705, a RS decoder/non-systematic RS parity remover 70G, and a derandomizer 707. The demodulating unit further includes a main data packet remover 708, a packet deformatter 709, and an enhanced data processor 710.

More specifically, the received data through a tuner inputs to the demodulator 701 and the known data detector 703. The demodulator 701 demodulates the tuned channel frequency so as to perform carrier recovery and timing recovery, thereby creating a baseband signal. Then, the demodulator 701 outputs the created baseband signal to the equalizer 702 and the known sequence detector 703. The equalizer 702 compensates for any channel distortion included in the demodulated signal. Thereafter, the equalizer 702 outputs the processed signal to the Viterbi decoder 704.

At this point, the known sequence detector 703 detects the known data symbol sequence inserted from the transmitter from the input/output data of the demodulator 701 (i.e., the data prior to demodulation or the data after demodulation). Then, the known sequence detector 703 outputs the detected sequence to the demodulator 701 and the equalizer 702. When the demodulator 701 uses the known data symbol sequence during the timing recovery or the carrier recovery, the demodulation performance may be enhanced. Similarly, when the equalizer 702 uses the known data symbol sequence, the equalization performance may be enhanced.

The Viterbi decoder 704 Viterbi-decodes the main symbol and the enhanced data symbol outputted from the equalizer 702, so as to convert the symbols into data bytes, thereby outputting the newly converted data bytes to the deinterleaver 705. The B-level value decided by the Viterbi decoder 704 is provided to the equalizer 702 so as to enhance the equalizing performance. The deinterleaver 705 performs the inverse operation of the data interleaver of the transmitter and, then, outputs the processed data to the RS decoder/non-systematic RS parity remover 706. If the received packet is the main data packet, the RS decoder/non-systematic RS parity remover 706 RS-decodes the received packet. Alternatively, if the received packet is the enhanced data packet, the RS decoder/non-systematic RS parity remover 706 removes the non-systematic RS parity byte from the received packet. Thereafter, the processed packet is outputted to the derandomizer 707.

The derandomizer 707 performs an inverse process of the randomizer so as to process the output of the RS decoder/non-systematic RS parity remover 706. Subsequently, the derandomizer 707 inserts a MPEG synchronization data byte at the beginning of each packet and outputs the processed packet in 188-byte units. The output of the derandomizer 707 is outputted to the main MPEG decoder (not shown) and to the main data packet remover 708 at the same time.

Meanwhile, the main data packet remover 708 removes the 188-byte unit main data packet from the data outputted from the derandomizer 707 and outputs the processed data to the packet deformatter 709. Subsequently, the packet deformatter 709 removes (or discards) the 4-byte MPEG header byte and the known data byte that have been inserted by the packet formatter of the transmitter, and also removes the null bit or repetition bit that has been inserted for the byte expansion from the processed data. Thereafter, the packet deformatter 709 outputs the processed data to the enhanced data processor 710. The enhanced data processor 710 performs an inverse process of the pre-processor 101 of the transmitter, so as to process the data outputted from the packet deformatter 709. Subsequently, the enhanced data processor 710 outputs the final output data.

Figure 11:
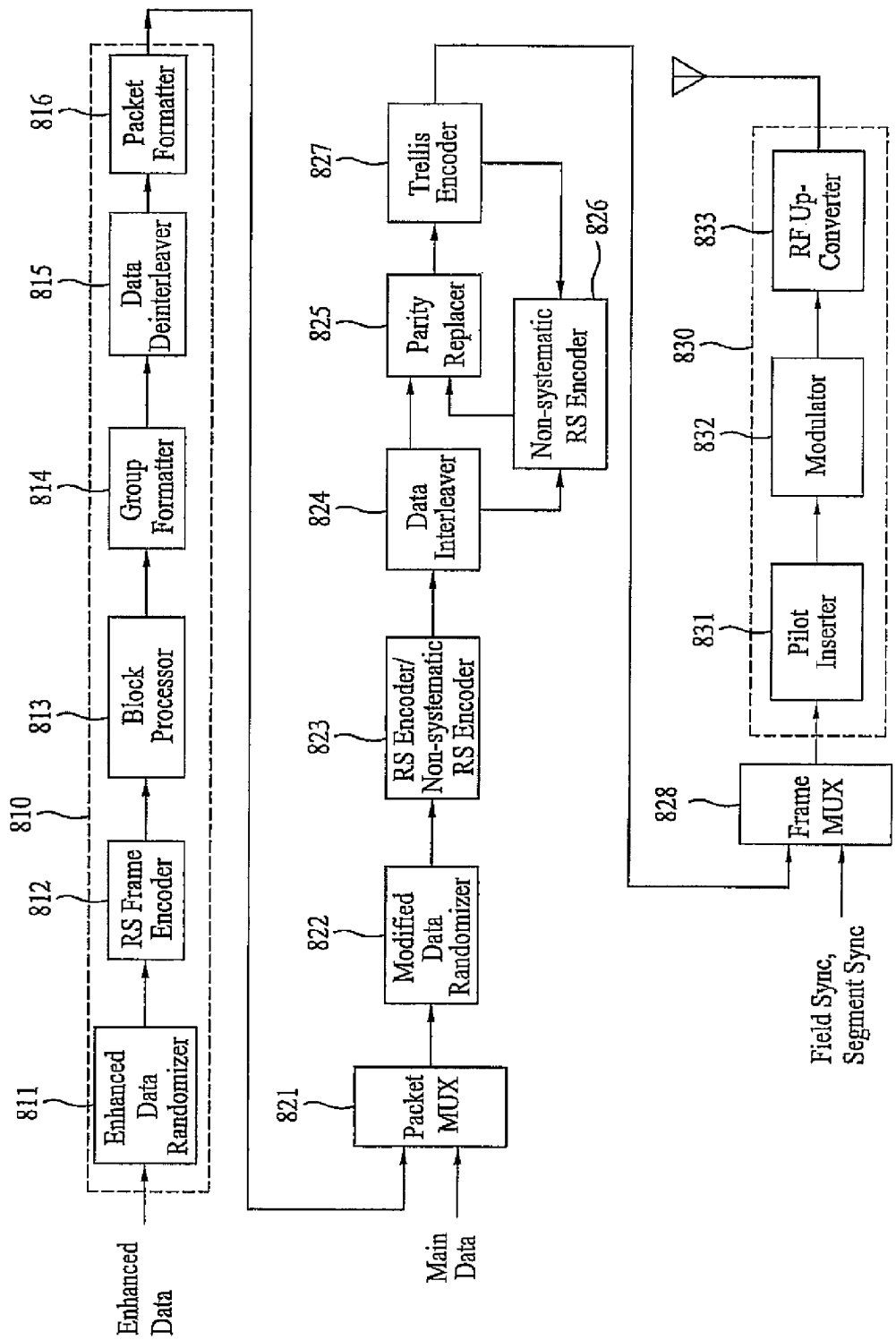
FIG. 11 illustrates a block diagram of a digital broadcast (or television or DTV) transmitter according to another embodiment of the present invention.

FIG. 11 illustrates a block diagram showing the structure of a digital broadcast transmitter according to an embodiment of the present invention. The digital broadcast transmitter includes a pre-processor 810, a packet multiplexer 821, a data randomizer 822, a Reed-Solomon (RS) encoder/non-systematic RS encoder 823, a data interleaver 824, a parity byte replacer 825, a non-systematic RS encoder 826, a frame multiplexer 828, and a transmitter 830. The pre-processor 810 includes an enhanced data randomizer 811, a RS frame encoder 812, a block processor 813, a group formatter 814, a data deinterleaver 815, and a packet formatter 816.

In the present invention having the above-described structure, main data are inputted to the packet multiplexer 821. Enhanced data are inputted to the enhanced data randomizer 811 of the pre-processor 810, wherein an additional coding process is performed so that the present invention can respond swiftly and appropriately against noise and change in channel. The enhanced data randomizer 811 randomizes the received enhanced data and outputs the randomized enhanced data to the RS frame encoder 812. At this point, by having the enhanced data randomizer 811 perform the randomizing process on the enhanced data, the randomizing process on the enhanced data by the data randomizer 822 in a later process may be omitted. Either the randomizer of the conventional broadcast system may be used as the randomizer for randomizing the enhanced data, or any other type of randomizer may be used herein.

The RS frame encoder 812 receives the randomized enhanced data and performs at least one of an error correction coding process and an error detection coding process on the received data. Accordingly, by providing robustness to the enhanced data, the data can scatter group error that may occur due to a change in the frequency environment. Thus, the data can respond appropriately to the frequency environment which is very poor and liable to change. The RS frame multiplexer 812 also includes a process of mixing in row units many sets of enhanced data each having a pre-determined size. By performing an error correction coding process on the inputted enhanced data, the RS frame encoder 812 adds data required for the error correction and, then, performs an error detection coding process, thereby adding data required for the error detection process. The error correction coding uses the RS coding method, and the error detection coding uses the cyclic redundancy check (CRC) coding method. When performing the RS coding process, parity data required for the error correction are generated. And, when performing the CRC coding process, CRC data required for the error detection are generated.

The RS frame encoder 812 performs CRC coding on the RS coded enhanced data in order to create the CRC code. The CRC code that is generated by the CRC coding process may be used to indicate whether the enhanced data have been damaged by an error while being transmitted through the channel. The present invention may adopt other types of error detection coding methods, apart from the CRC coding method, and may also use the error correction coding method so as to enhance the overall error correction ability of the receiver. For example, assuming that the size of one RS frame is 187*N bytes, that (235, 187)-RS coding process is performed on each column within the RS frame, and that a CRC coding process using a 2-byte (i.e., 16-bit) CRC checksum, then a RS frame having the size of 187*N bytes is expanded to a RS frame of 235*(N+2) bytes. The RS frame expanded by the RS frame encoder 812 is inputted to the block processor 813. The block processor 813 codes the RS-coded and CRC-coded enhanced data at a coding rate of G/H. Then, the block processor 813 outputs the G/H-rate coded enhanced data to the group formatter 814. In order to do so, the block processor 813 identifies the block data bytes being inputted from the RS frame encoder 812 as bits.

The block processor 813 may receive supplemental information data such as signaling information, which include information on the system, and identifies the supplemental information data bytes as data bits. Herein, the supplemental information data, such as the signaling information, may equally pass through the enhanced data randomizer 811 and the RS frame encoder 812 so as to be inputted to the block processor 813. Alternatively, the supplemental information data may be directly inputted to the block processor 813 without passing through the enhanced data randomizer 811 and the RS frame encoder 812. The signaling information corresponds to information required for receiving and processing data included in the data group in the receiver. Such signaling information includes data group information, multiplexing information, and burst information.

As a G/H-rate encoder, the E-VSB block processor 813 codes the inputted data at a coding rate of G/H and then outputs the G/H-rate coded data. For example, if 1 bit of the input data is coded to 2 bits and outputted, then G is equal to 1 and H is equal to 2 (i.e., G=1 and H=2). Alternatively, if 1 bit of the input data is coded to 4 bits and outputted, then G is equal to 1 and H is equal to 4 (i.e., G=1 and H=4). As an example of the present invention, it is assumed that the block processor 813 performs a coding process at a coding rate of ½ (also referred to as a ½-rate coding process) or a coding process at a coding rate of ¼ (also referred to as a ¼-rate coding process). More specifically, the block processor 813 codes the received enhanced data and supplemental information data, such as the signaling information, at either a coding rate of ½ or a coding rate of ¼. Thereafter, the supplemental information data, such as the signaling information, are identified and processed as enhanced data.

Since the ¼-rate coding process has a higher coding rate than the ½-rate coding process, greater error correction ability may be provided. Therefore, in a later process, by allocating the ¼-rate coded data in an area with deficient receiving performance within the group formatter 814, and by allocating the ½-rate coded data in an area with excellent receiving performance, the difference in the overall performance may be reduced. More specifically, in case of performing the ½-rate coding process, the E-VSB block processor 813 receives 1 bit and codes the received 1 bit to 2 bits (i.e., 1 symbol). Then, the E-VSB block processor 813 outputs the processed 2 bits (or 1 symbol). On the other hand, in case of performing the ¼-rate coding process, the E-VSB block processor 813 receives 1 bit and codes the received 1 bit to 4 bits (i.e., 2 symbols). Then, the E-VSB block processor 813 outputs the processed 4 bits (or 2 symbols). Additionally, the block processor 813 performs a block interleaving process in symbol units on the symbol-coded data. Subsequently, the block processor 813 converts to bytes the data symbols that are block-interleaved and have the order rearranged.

The group formatter 814 inserts the enhanced data outputted from the block processor 813 (herein, the enhanced data may include supplemental information data such as signaling information including transmission information) in a corresponding area within the data group, which is configured according to a pre-defined rule. Furthermore, in relation with the data deinterleaving process, various types of places holders or known data are also inserted in corresponding areas within the data group. At this point, the data group may be described by at least one hierarchical area. Herein, the data allocated to the each area may vary depending upon the characteristic of each hierarchical area. Additionally, each group is configured to include a field synchronization signal.

The present invention shows an example of the data group being divided into three hierarchical areas: a head area, a body area, and a tail area. Accordingly, in the data group that is inputted for the data deinterleaving process, data are first inputted to the head area, then inputted to the body area, and inputted finally to the tail area. In the example of the present invention, the head, body, and tail areas are configured so that the body area is not mixed with the main data area within the data group. Furthermore, in the present invention, the head, body, and tail areas may each be divided into lower hierarchical areas. For example, the head area may be divided into 3 lower hierarchical areas: a far head (FH) area, a middle head (MH) area, and a near head (NH) area. The body area may be divided into 4 lower hierarchical areas: a first lower body (B1) area, a second lower body (B2) area, a third lower body (B3) area, and a fourth lower body (B4) area. And, finally, the tail area may be divided into 2 lower hierarchical areas: a far tail (FT) area and a near tail (NT) area.

In the example of the present invention, the group formatter 814 inserts the enhanced data being outputted from the block processor 813 to the middle head (MH) area, the near head (NH) area, the first to fourth lower body (B1 to B4) areas, and the near tail (NT) area. Herein, the type of enhanced data may vary depending upon the characteristic of each area. The data group is divided into a plurality of areas so that each area may be used for different purposes. More specifically, areas having less interference with the main data may show more enhanced receiving performance as compared with area having more interference with the main data. Additionally, when using the system in which the known data are inserted in the data group and then transmitted, and when a long set of consecutive known data is to be periodically (or regularly) inserted in the enhanced data, the body area is capable of regularly receiving such enhanced data having a predetermined length. However, since the enhanced data may be mixed with the main data in the head and tail areas, it is difficult to regularly insert the known data in these areas, and it is also difficult to insert long known data sets that are consecutive in these areas.

Details such as the size of the data group, the number of hierarchical areas within the data group and the size of each hierarchical area, and the number of enhanced data bytes that may be inserted in each hierarchical area may vary depending upon the design of the system designer. Therefore, the above-described embodiment is merely an example that can facilitate the description of the present invention. In the group formatter 814, the data group may be configured to include a position (or place) in which the field synchronization signal is to be inserted. When assuming that the data group is divided into a plurality of hierarchical areas as described above, the block processor 813 may code the data that are to be inserted in each area at different coding rates.

In the present invention, based upon the areas that are each expected to show different performance after the equalization process when using the channel information that may be used for the channel equalization process in the receiver, a different coding rate may be applied to each of these areas. For example, the block processor 813 codes the enhanced data that are to be inserted in the near head (NH) area and the first to fourth lower body (B1 to B4) areas at a ½-coding rate. Thereafter, the group formatter 814 may insert the ½-rate coded enhanced data in the near head (NH) area and the first to fourth lower body (B1 to B4) areas. On the other hand, the block processor 813 codes the enhanced data that are to be inserted in the middle head (MH) area and the near tail (NT) area at a ¼-coding rate, which has greater error correction ability than the ½-coding rate. Subsequently, the group formatter 814 may insert the ½-rate coded enhanced data in the middle head (MH) area and the near tail (NT) area. Furthermore, the block processor 813 codes the enhanced data that are to be inserted in the far head (FH) area and the far tail (FT) area at a coding rate having even greater error correction ability than the ¼-coding rate. Thereafter, the group formatter 814 may inserts the coded enhanced data either in the far head (FH) and far tail (FT) areas or in a reserved area for future usage.

Apart from the enhanced data, the group formatter 813 may also insert supplemental information data such as signaling information indicating the overall transmission information in the data group. Also, apart from the coded enhanced data outputted from the block processor 813, and in relation with the data deinterleaving process in a later process, the group formatter 814 may also insert a MPEG header place holder, a non-systematic RS parity place holder, and a main data place holder in the data group. Herein, the main data group place holder is inserted because the enhanced data and the main data may be mixed in the head and tail areas depending upon the input of the data deinterleaver. For example, based upon the output of the data after being deinterleaved, the place holder for the MPEG header may be allocated to the front of each data packet. Additionally, the group formatter 814 may either insert known data generated according to a pre-defined rule, or insert a known data place holder for inserting known data in a later process. Furthermore, a place holder for the initialization of the trellis encoder module 827 is inserted in a corresponding area. For example, the initialization data place holder may be inserted at the beginning (or front) of the data place sequence.

The output of the group formatter 814 is inputted to the data deinterleaver 815. And, the data deinterleaver 815 performs an inverse process of the data interleaver deinterleaving the data and place holder within the data group being outputted from the group formatter 814. Thereafter, the data deinterleaver 815 outputs the deinterelaved data to the packet formatter 816. Among the data deinterleaved and inputted, the packet formatter 816 removes the main data place holder and RS parity place holder that were allocated for the deinterleaving process from the inputted deinterleaved data. Thereafter, the remaining portion of the corresponding data is grouped, and 4 bytes of MPEG header are inserted therein. The 4-byte MPEG header is configured of a 1-byte MPEG synchronization byte added to the 3-byte MPEG header place holder.

When the group formatter 814 inserts the known data place holder, the packet formatter 816 may either insert actual known data in the known data place holder or output the known data place holder without any change or modification for a replacement insertion in a later process. Afterwards, the packet formatter 816 divides the data within the above-described packet-formatted data group into 188-byte unit enhanced data packets (i.e., MPEG TS packets), which are then provided to the packet multiplexer 821. The packet multiplexer 821 multiplexes the 188-byte unit enhanced data packet and main data packet outputted from the packet formatter 816 according to a pre-defined multiplexing method. Subsequently, the multiplexed data packets are outputted to the data randomizer 822. The multiplexing method may be modified or altered in accordance with diverse variables of the system design.

As an example of the multiplexing method of the packet multiplexer 821, the enhanced data burst section and the main data section may be identified along a time axis (or a chronological axis) and may be alternately repeated. At this point, the enhanced data burst section may transmit at least one data group, and the main data section may transmit only the main data. The enhanced data burst section may also transmit the main data. If the enhanced data are outputted in a burst structure, as described above, the receiver receiving only the enhanced data may turn the power on only during the burst section so as to receive the enhanced data, and may turn the power off during the main data section in which main data are transmitted, so as to prevent the main data from being received, thereby reducing the power consumption of the receiver.

When the data being inputted correspond to the main data packet, the data randomizer 822 performs the same randomizing process of the conventional randomizer. More specifically, the MPEG synchronization byte included in the main data packet is discarded and a pseudo random byte generated from the remaining 187 bytes is used so as to randomize the data. Thereafter, the randomized data are outputted to the RS encoder/non-systematic RS encoder 823. However, when the inputted data correspond to the enhanced data packet, the MPEG synchronization byte of the 4-byte MPEG header included in the enhanced data packet is discarded, and data randomizing is performed only on the remaining 3-byte MPEG header. Randomizing is not performed on the remaining portion of the enhanced data. Instead, the remaining portion of the enhanced data is outputted to the RS encoder/non-systematic RS encoder 823. This is because the randomizing process has already been performed on the enhanced data by the enhanced data randomizer 811 in an earlier process. Herein, a data randomizing process may or may not be performed on the known data (or known data place holder) and the initialization data place holder included in the enhanced data packet.

The RS encoder/non-systematic RS encoder 823 RS-codes the data randomized by the data randomizer 822 or the data bypassing the data randomizer 822. Then, the RS encoder/non-systematic RS encoder 823 adds a 20-byte RS parity to the coded data, thereby outputting the RS-parity-added data to the data interleaver 824. At this point, if the inputted data correspond to the main data packet, the RS encoder/non-systematic RS encoder 823 performs a systematic RS-coding process identical to that of the conventional receiver on the inputted data, thereby adding the 20-byte RS parity at the end of the 187-byte data. Alternatively, if the inputted data correspond to the enhanced data packet, the 20 bytes of RS parity gained by performing the non-systematic RS-coding are respectively inserted in the decided parity byte places within the enhanced data packet. Herein, the data interleaver 824 corresponds to a byte unit convolutional interleaver. The output of the data interleaver 824 is inputted to the parity byte replacer 825 and the non-systematic RS encoder 826.

Meanwhile, a memory within the trellis encoding module 827, which is positioned after the parity byte replacer 825, should first be initialized in order to allow the output data of the trellis encoding module 827 so as to become the known data defined based upon an agreement between the receiver and the transmitter. More specifically, the memory of the trellis encoding module 827 should first be initialized before the known data sequence being inputted is trellis-encoded. At this point, the beginning of the known data sequence that is inputted corresponds to the initialization data place holder inserted by the group formatter 814 and not the actual known data. Therefore, a process of generating initialization data right before the trellis-encoding of the known data sequence being inputted and a process of replacing the initialization data place holder of the corresponding trellis encoding module memory with the newly generated initialization data are required.

A value of the trellis memory initialization data is decided based upon the memory status of the trellis encoding module 827, thereby generating the trellis memory initialization data accordingly. Due to the influence of the replace initialization data, a process of recalculating the RS parity, thereby replacing the RS parity outputted from the trellis encoding module 827 with the newly calculated RS parity is required. Accordingly, the non-systematic RS encoder 826 receives the enhanced data packet including the initialization data place holder that is to be replaced with the initialization data from the data interleaver 824 and also receives the initialization data from the trellis encoding module 827. Thereafter, among the received enhanced data packet, the initialization data place holder is replaced with the initialization data. Subsequently, the RS parity data added to the enhanced data packet are removed. Then, a new non-systematic RS parity is calculated and outputted to the parity byte replacer 825. Accordingly, the parity byte replacer 825 selects the output of the data interleaver 824 as the data within the enhanced data packet, and selects the output of the non-systematic RS encoder 826 as the RS parity. Thereafter, the parity byte replacer 825 outputs the selected data.

Meanwhile, if the main data packet is inputted, or if the enhanced data packet that does not include the initialization data place holder that is to be replaced, the parity byte replacer 825 selects the data and RS parity outputted from the data interleaver 824 and directly outputs the selected data to the trellis encoding module 827 without modification. The trellis encoding module 827 converts the byte-unit data to symbol-unit data and 12-way interleaves and trellis-encodes the converted data, which are then outputted to the frame multiplexer 828. The frame multiplexer 828 inserts field synchronization and segment synchronization signals in the output of the trellis encoding module 827 and then outputs the processed data to the transmitter 830. Herein, the transmitter 830 includes a pilot inserter 831, a modulator 832, and a radio frequency (RF) up-converter 833. The operation of the transmitter 830 is identical to the conventional transmitters. Therefore, a detailed description of the same will be omitted for simplicity.

Figure 12:
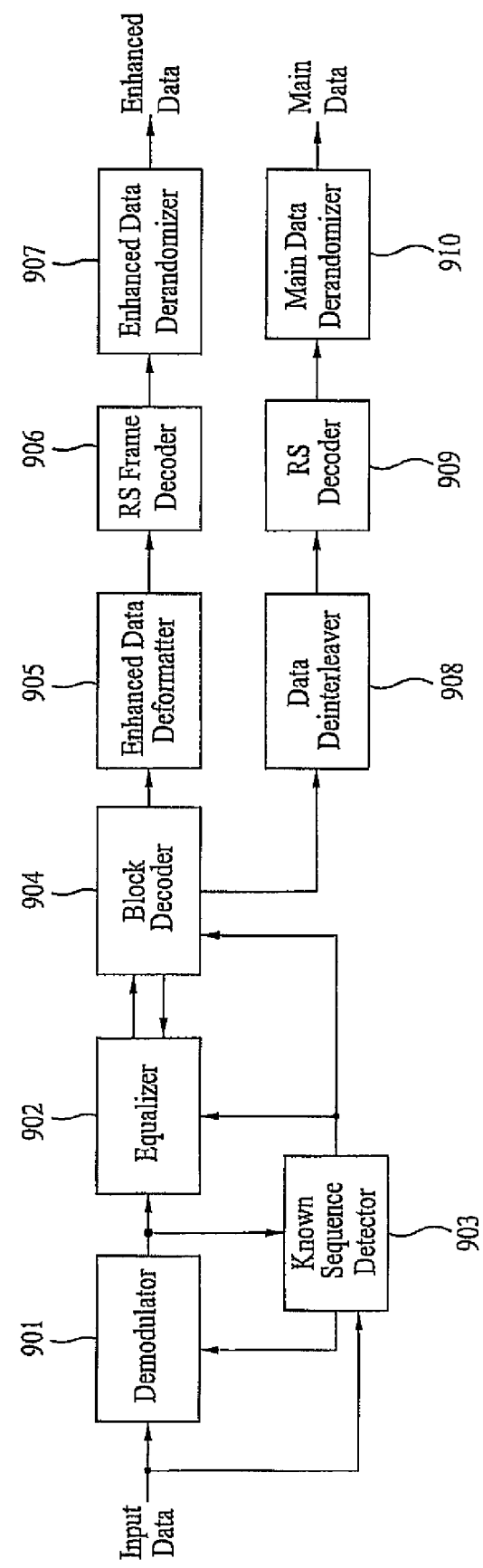
FIG. 12 illustrates a block diagram showing a general structure of a demodulating unit within a digital broadcast (or television or DTV) receiver according to another embodiment of the present invention.

FIG. 12 illustrates a block diagram of a demodulating unit included in the receiver according to another embodiment of the present invention. Herein, the demodulating unit may effectively process signals transmitted from the transmitter shown in FIG. 11. Referring to FIG. 12, the demodulating unit includes a demodulator 901, a channel equalizer 902, a known data detector 903, a block decoder 904, an enhanced data deformatter 905, a RS frame decoder 906, an enhanced data derandomizer 907, a data deinterleaver 908, a RS decoder 909, and a main data derandomizer 910. For simplicity, the demodulator 901, the channel equalizer 902, the known data detector 903, the block decoder 904, the enhanced data deformatter 905, the RS frame decoder 906, and the enhanced data derandomizer 907 will be referred to as an enhanced data processor. And, the data deinterleaver 908, the RS decoder 909, and the main data derandomizer 910 will be referred to as a main data processor.

More specifically, the enhanced data including known data and the main data are received through the tuner and inputted to the demodulator 901 and the known data detector 903. The demodulator 901 performs automatic gain control, carrier wave recovery, and timing recovery on the data that are being inputted, thereby creating baseband data, which are then outputted to the equalizer 902 and the known data detector 903. The equalizer 902 compensates the distortion within the channel included in the demodulated data. Then, the equalizer 902 outputs the compensated data to the block decoder 904.

At this point, the known data detector 903 detects the known data place inserted by the transmitter to the input/output data of the demodulator 901 (i.e., data prior to demodulation or data after demodulation). Then, along with the position information, the known data detector 903 outputs the symbol sequence of the known data generated from the corresponding position to the demodulator 901 and the equalizer 902. Additionally, the known data detector 903 outputs information enabling the block decoder 904 to identify the enhanced data being additionally encoded by the transmitter and the main data that are not additionally encoded to the block decoder 904. Furthermore, although the connection is not shown in FIG. 12, the information detected by the known data detector 903 may be used in the overall receiver and may also be used in the enhanced data formatter 905 and the RS frame decoder 906.

By using the known data symbol sequence when performing the timing recovery or carrier wave recovery, the demodulating performance of the demodulator 901 may be enhanced. Similarly, by using the known data, the channel equalizing performance of the channel equalizer 902 may be enhanced. Furthermore, by feeding-back the demodulation result of the block demodulator 904, the channel equalizing performance may also be enhanced. Herein, the channel equalizer 902 may perform channel equalization through various methods. In the present invention, a method of estimating a channel impulse response (CIR) for performing the channel equalization process will be given as an example of the present invention. More specifically, in the present invention, the channel impulse response (CIR) is differently estimated and applied in accordance with each hierarchical area within the data group that are transmitted from the transmitter. Furthermore, by using the known data having the position (or place) and contents pre-known according to an agreement between the transmitter and the receiver, so as to estimate the CIR, the channel equalization process may be processed with more stability.

In the present invention, one data group that is inputted for channel equalization is divided into three hierarchical areas: a head area, a body area, and a tail area. Then, each of the areas is divided into lower hierarchical areas. More specifically, the head area may be divided into a far head (FH) area, a middle head (MH) area, and a near head (NH) area. And, the tail area may be divided into a far tail (FT) area and a near tail (NT) area. Furthermore, based upon a long known data sequence, the body area may be divided into 4 lower hierarchical areas: a first lower body (B1) area, a second lower body (B2) area, a third lower body (B3) area, and a fourth lower body (B4) area. In performing channel equalization on the data within the data group by using the CIR estimated from the field synchronization signal and the known data sequence, and in accordance with the characteristic of each area, either one of the estimated CIRs may be directly used without modification, or a CIR created by interpolating or extrapolating a plurality of CIRs may be used.

Meanwhile, if the data being channel equalized and then inputted to the block decoder 904 correspond to the enhanced data on which additional encoding and trellis encoding are both performed by the transmitter, trellis-decoding and additional decoding processes are performed as inverse processes of the transmitter. Alternatively, if the data being channel equalized and then inputted to the block decoder 904 correspond to the main data on which additional encoding is not performed and only trellis-encoding is performed by the transmitter, only the trellis-decoding process is performed. The data group decoded by the block decoder 904 is inputted to the enhanced data deformatter 905, and the main data packet is inputted to the data deinterleaver 908.

More specifically, if the inputted data correspond to the main data, the block decoder 904 performs Viterbi decoding on the inputted data, so as to either output a hard decision value or hard-decide a soft decision value and output the hard-decided result. On the other hand, if the inputted correspond to the enhanced data, the block decoder 904 outputs either a hard decision value or a soft decision value on the inputted enhanced data. In other words, if the data inputted to the block decoder 904 correspond to the enhanced data, the block decoder 904 performs a decoding process on the data encoded by the block processor and the trellis encoder of the transmitter. At this point, the output of the RS frame encoder included in the pre-processor of the transmitter becomes an external code, and the output of the block processor and the trellis encoder becomes an internal code. In order to show maximum performance of the external code when decoding such connection codes, the decoder of the internal code should output a soft decision value. Therefore, the block decoder 904 may output a hard decision value on the enhanced data. However, when required, it is more preferable that the block decoder 904 outputs a soft decision value.

The present invention may also be used for configuring a reliability map using the soft decision value. The reliability map determines and indicates whether a byte corresponding to a group of 8 bits decided by the code of the soft decision value is reliable. For example, when an absolute value of the soft decision value exceeds a pre-determined threshold value, the value of the bit corresponding to the soft decision value code is determined to be reliable. However, if the absolute value does not exceed the pre-determined threshold value, then the value of the corresponding bit is determined to be not reliable. Further, if at least one bit among the group of 8 bits, which are determined based upon the soft decision value, is determined to be not reliable, then the reliability map indicates that the entire byte is not reliable. Herein, the process of determining the reliability by 1-bit units is merely exemplary. The corresponding byte may also be indicated to be not reliable if a plurality of bits (e.g., 4 bits) is determined to be not reliable.

Conversely, when all of the bits are determined to be reliable within one byte (i.e., when the absolute value of the soft value of all bits exceeds the pre-determined threshold value), then the reliability map determines and indicates that the corresponding data byte is reliable. Similarly, when more than 4 bits are determined to be reliable within one data byte, then the reliability map determines and indicates that the corresponding data byte is reliable. The estimated numbers are merely exemplary and do not limit the scope and spirit of the present invention. Herein, the reliability map may be used when performing error correction decoding processes.

Meanwhile, the data deinterleaver 908, the RS decoder 909, and the main data derandomizer 910 are blocks required for receiving the main data. These blocks may not be required in a receiver structure that receives only the enhanced data. The data deinterleaver 908 performs an inverse process of the data interleaver of the transmitter. More specifically, the data deinterleaver 908 deinterleaves the main data being outputted from the block decode 904 and outputs the deinterleaved data to the RS decoder 909. The RS decoder 909 performs systematic RS decoding on the deinterleaved data and outputs the systematically decoded data to the main data derandomizer 910. The main data derandomizer 910 receives the data outputted from the RS decoder 909 so as to generate the same pseudo random byte as that of the randomizer in the transmitter. The main data derandomizer 910 then performs a bitwise exclusive OR (XOR) operation on the generated pseudo random data byte, thereby inserting the MPEG synchronization bytes to the beginning of each packet so as to output the data in 188-byte main data packet units.

Herein, the format of the data being outputted to the enhanced data deformatter 905 from the block decoder 904 is a data group format. At this point, the enhanced data deformatter 905 already knows the structure of the input data. Therefore, the enhanced data deformatter 905 identifies the system information including signaling information and the enhanced data from the data group. Thereafter, the identified signaling information is transmitted to where the system information is required, and the enhanced data are outputted to the RS frame decoder 906. The enhanced data deformatter 905 removes the known data, trellis initialization data, and MPEG header that were included in the main data and the data group and also removes the RS parity that was added by the RS encoder/non-systematic RS encoder of the transmitter. Thereafter, the processed data are outputted to the RS frame decoder 906.

More specifically, the RS frame decoder 906 receives the RS-coded and CRC-coded enhanced data from the enhanced data deformatter 905 so as to configure the RS frame. The RS frame decoder 906 performs an inverse process of the RS frame encoder included in the transmitter, thereby correcting the errors within the RS frame. Then, the 1-byte MPEG synchronization byte, which was removed during the RS frame coding process, is added to the error corrected enhanced data packet. Subsequently, the processed data are outputted to the enhanced data derandomizer 907. Herein, the enhanced data derandomizer 907 performs a derandomizing process, which corresponds to an inverse process of the enhanced data randomizer included in the transmitter, on the received enhanced data. Then, by outputting the processed data, the enhanced data transmitted from the transmitter can be obtained.

According to an embodiment of the present invention, the RS frame decoder 906 may also be configured as follows. The RS frame decoder 906 may perform a CRC syndrome check on the RS frame, thereby verifying whether or not an error has occurred in each row. Subsequently, the CRC checksum is removed and the presence of an error is indicated on a CRC error flag corresponding to each row. Then, a RS decoding process is performed on the RS frame having the CRC checksum removed in a column direction. At this point, depending upon the number of CRC error flags, a RS erasure decoding process may be performed. More specifically, by checking the CRC error flags corresponding to each row within the RS frame, the number of CRC error flags may be determined whether it is greater or smaller than the maximum number of errors, when RS decoding the number of rows with errors (or erroneous rows) in the column direction. Herein, the maximum number of errors corresponds to the number of parity bytes inserted during the RS decoding process. As an example of the present invention, it is assumed that 48 parity bytes are added to each column.

If the number of rows with CRC errors is equal to or smaller than the maximum number of errors (e.g., 48), which may be corrected by the RS erasure decoding process, the RS erasure decoding process is performed on the RS frame in the column direction. Thereafter, the 48 bytes of parity data that were added at the end of each column are removed. However, if the number of rows with CRC errors is greater than the maximum number of errors (e.g., 48), which may be corrected by the RS erasure decoding process, the RS erasure decoding process cannot be performed. In this case, the error may be corrected by performing a general RS decoding process.

As another embodiment of the present invention, the error correction ability may be enhanced by using the reliability map created when configuring the RS frame from the soft decision value. More specifically, the RS frame decoder 906 compares the absolute value of the soft decision value obtained from the block decoder 904 to the pre-determined threshold value so as to determine the reliability of the bit values that are decided by the code of the corresponding soft decision value. Then, B bits are grouped to configure a byte. Then, the reliability information of the corresponding byte is indicated on the reliability map. Therefore, even if a specific row is determined to have CRC errors as a result of the CRC syndrome checking process of the corresponding row, it is not assumed that all of the data bytes included in the corresponding row have error. Instead, only the data bytes that are determined to be not reliable, after referring to the reliability information on the reliability map, are set to have errors. In other words, regardless of the presence of CRC errors in the corresponding row, only the data bytes that are determined to be not reliable (or unreliable) by the reliability map are set as erasure points.

Thereafter, if the number of erasure points for each column is equal to or smaller than the maximum number of errors (e.g., 48), the RS erasure decoding process is performed on the corresponding the column. Conversely, if the number of erasure points is greater than the maximum number of errors (e.g., 48), which may be corrected by the RS erasure decoding process, a general decoding process is performed on the corresponding column. In other words, if the number of rows having CRC errors is greater than the maximum number of errors (e.g., 48), which may be corrected by the RS erasure decoding process, either a RS erasure decoding process or a general RS decoding process is performed on a particular column in accordance with the number of erasure point within the corresponding column, wherein the number is decided based upon the reliability information on the reliability map. When the above-described process is performed, the error correction decoding process is performed in the direction of all of the columns included in the RS frame. Thereafter, the 48 bytes of parity data added to the end of each column are removed.

Figure 13:
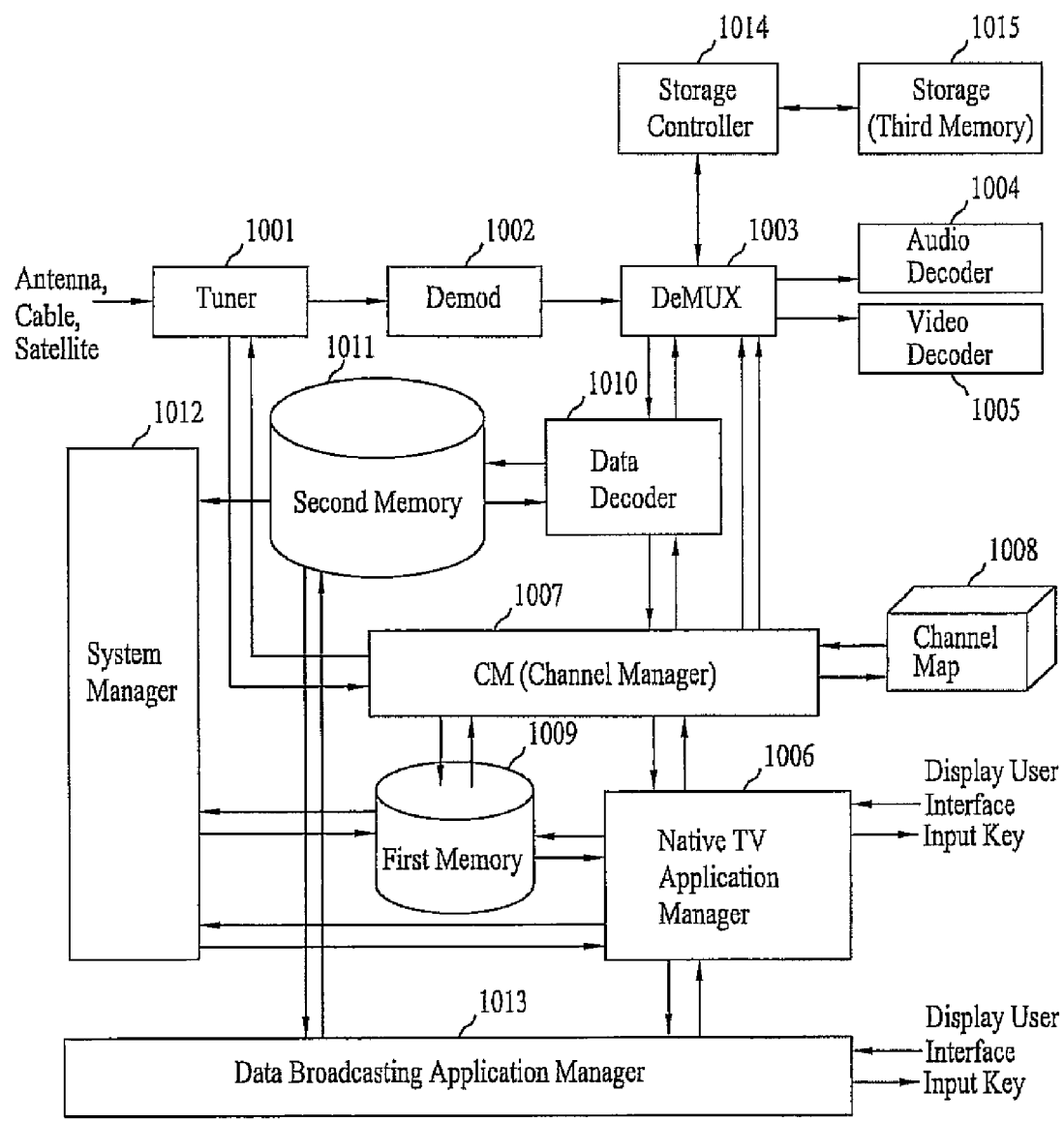
FIG. 13 illustrates a block diagram showing the structure of a digital broadcast (or television or DTV) receiver according to an embodiment of the present invention.

FIG. 13 illustrates a block diagram showing the structure of a digital broadcast receiver according to an embodiment of the present invention. Referring to FIG. 13, the digital broadcast receiver includes a tuner 1001, a demodulating unit 1002, a demultiplexer 1003, an audio decoder 1004, a video decoder 1005, a native TV application manager 1006, a channel manager 1007, a channel map 1008, a first memory 1009, a data decoder 1010, a second memory 1011, a system manager 1012, a data broadcasting application manager 1013, a storage controller 1014, and a third memory 1015. Herein, the third memory 1015 is a mass storage device, such as a hard disk drive (HDD) or a memory chip. The tuner 1001 tunes a frequency of a specific channel through any one of an antenna, cable, and satellite. Then, the tuner 1001 down-converts the tuned frequency to an intermediate frequency (IF), which is then outputted to the demodulating unit 1002. At this point, the tuner 1001 is controlled by the channel manager 1007. Additionally, the result and strength of the broadcast signal of the tuned channel are also reported to the channel manager 1007. The data that are being received by the frequency of the tuned specific channel include main data, enhanced data, and table data for decoding the main data and enhanced data.

In the embodiment of the present invention, examples of the enhanced data may include data provided for data service, such as Java application data, HTML application data, XML data, and so on. The data provided for such data services may correspond either to a Java class file for the Java application, or to a directory file designating positions (or locations) of such files. Furthermore, such data may also correspond to an audio file and/or a video file used in each application. The data services may include weather forecast services, traffic information services, stock information services, services providing information quiz programs providing audience participation services, real time poll, user interactive education programs, gaming services, services providing information on soap opera (or TV series) synopsis, characters, original sound track, filing sites, services providing information on past sports matches, profiles and accomplishments of sports players, product information and product ordering services, services providing information on broadcast programs by media type, airing time, subject, and so on. The types of data services described above are only exemplary and are not limited only to the examples given herein. Furthermore, depending upon the embodiment of the present invention, the enhanced data may correspond to meta data. For example, the meta data use the XML application so as to be transmitted through a DSM-CC protocol.

The demodulating unit 1002 performs VSB-demodulation and channel equalization on the signal being outputted from the tuner 1001, thereby identifying the main data and the enhanced data. Thereafter, the identified main data and enhanced data are outputted in TS packet units. Examples of the demodulating unit 1002 is shown in FIG. 10 and FIG. 12. The demodulating unit shown in FIG. 10 and FIG. 12 is merely exemplary and the scope of the present invention is not limited to the examples set forth herein. In the embodiment given as an example of the present invention, only the enhanced data packet outputted from the demodulating unit 1002 is inputted to the demultiplexer 1003. In this case, the main data packet is inputted to another demultiplexer (not shown) that processes main data packets. Herein, the storage controller 1014 is also connected to the other demultiplexer in order to store the main data after processing the main data packets. The demultiplexer of the present invention may also be designed to process both enhanced data packets and main data packets in a single demultiplexer.

The storage controller 1014 is interfaced with the demultiplexer so as to control instant recording, reserved (or pre-programmed) recording, time shift, and so on of the enhanced data and/or main data. For example, when one of instant recording, reserved (or pre-programmed) recording, and time shift is set and programmed in the receiving system (or receiver) shown in FIG. 13, the corresponding enhanced data and/or main data that are inputted to the demultiplexer are stored in the third memory 1015 in accordance with the control of the storage controller 1014. The third memory 1015 may be described as a temporary storage area and/or a permanent storage area. Herein, the temporary storage area is used for the time shifting function, and the permanent storage area is used for a permanent storage of data according to the user's choice (or decision).

When the data stored in the third memory 1015 need to be reproduced (or played), the storage controller 1014 reads the corresponding data stored in the third memory 1015 and outputs the read data to the corresponding demultiplexer (e.g., the enhanced data are outputted to the demultiplexer 1003 shown in FIG. 13). At this point, according to the embodiment of the present invention, since the storage capacity of the third memory 1015 is limited, the compression encoded enhanced data and/or main data that are being inputted are directly stored in the third memory 1015 without any modification for the efficiency of the storage capacity. In this case, depending upon the reproduction (or reading) command, the data read from the third memory 1015 pass trough the demultiplexer so as to be inputted to the corresponding decoder, thereby being restored to the initial state.

The storage controller 1014 may control the reproduction (or play), fast-forward, rewind, slow motion, instant replay functions of the data that are already stored in the third memory 1015 or presently being buffered. Herein, the instant replay function corresponds to repeatedly viewing scenes that the viewer (or user) wishes to view once again. The instant replay function may be performed on stored data and also on data that are currently being received in real time by associating the instant replay function with the time shift function. If the data being inputted correspond to the analog format, for example, if the transmission mode is NTSC, PAL, and so on, the storage controller 1014 compression encodes the inputted data and stored the compression-encoded data to the third memory 1015. In order to do so, the storage controller 1014 may include an encoder, wherein the encoder may be embodied as one of software, middleware, and hardware. Herein, an MPEG encoder may be used as the encoder according to an embodiment of the present invention. The encoder may also be provided outside of the storage controller 1014.

Meanwhile, in order to prevent illegal duplication (or copies) of the input data being stored in the third memory 1015, the storage controller 1014 scrambles the input data and stores the scrambled data in the third memory 1015. Accordingly, the storage controller 1014 may include a scramble algorithm for scrambling the data stored in the third memory 1015 and a descramble algorithm for descrambling the data read from the third memory 1015. Herein, the definition of scramble includes encryption, and the definition of descramble includes decryption. The scramble method may include using an arbitrary key (e.g., control word) to modify a desired set of data, and also a method of mixing signals.

Meanwhile, the demultiplexer 1003 receives the real-time data outputted from the demodulating unit 1002 or the data read from the third memory 1015 and demultiplexes the received data. In the example given in the present invention, the demultiplexer 1003 performs demultiplexing on the enhanced data packet. Therefore, in the present invention, the receiving and processing of the enhanced data will be described in detail. It should also be noted that a detailed description of the processing of the main data will be omitted for simplicity starting from the description of the demultiplexer 1003 and the subsequent elements.

The demultiplexer 1003 demultiplexes enhanced data and program specific information/program and system information protocol (PSI/PSIP) tables from the enhanced data packet inputted in accordance with the control of the data decoder 1010. Thereafter, the demultiplexed enhanced data and PSI/PSIP tables are outputted to the data decoder 1010 in a section format. In order to extract the enhanced data from the channel through which enhanced data are transmitted and to decode the extracted enhanced data, system information is required. Such system information may also be referred to as service information. The system information may include channel information, event information, etc. In the embodiment of the present invention, the PSI/PSIP tables are applied as the system information. However, the present invention is not limited to the example set forth herein. More specifically, regardless of the name, any protocol transmitting system information in a table format may be applied in the present invention.

The PSI table is an MPEG-2 system standard defined for identifying the channels and the programs. The PSIP table is an advanced television systems committee (ATSC) standard that can identify the channels and the programs. The PSI table may include a program association table (PAT), a conditional access table (CAT), a program map table (PMT), and a network information table (NIT). Herein, the PAT corresponds to special information that is transmitted by a data packet having a PID of '0'. The PAT transmits PID information of the PMT and PID information of the NIT corresponding to each program. The CAT transmits information on a paid broadcast system used by the transmitting system. The PMT transmits PID information of a transport stream (TS) packet, in which program identification numbers and individual bit sequences of video and audio data configuring the corresponding program are transmitted, and the PID information, in which PCR is transmitted. The NIT transmits information of the actual transmission network.

The PSIP table may include a virtual channel table (VCT), a system time table (STT), a rating region table (RRT), an extended text table (ETT), a direct channel change table (DCCT), an event information table (EIT), and a master guide table (MGT). The VCT transmits information on virtual channels, such as channel information for selecting channels and information such as packet identification (PID) numbers for receiving the audio and/or video data. More specifically, when the VCT is parsed, the PID of the audio/video data of the broadcast program may be known. Herein, the corresponding audio/video data are transmitted within the channel along with the channel name and the channel number. The STT transmits information on the current data and timing information. The RRT transmits information on region and consultation organs for program ratings. The ETT transmits additional description of a specific channel and broadcast program. The EIT transmits information on virtual channel events (e.g., program title, program start time, etc.). The DCCT/DCCSCT transmits information associated with automatic (or direct) channel change. And, the MGT transmits the versions and PID information of the above-mentioned tables included in the PSIP.

Each of the above-described tables included in the PSI/PSIP is configured of a basic unit referred to as a "section", and a combination of one or more sections forms a table. For example, the VCT may be divided into 256 sections. Herein, one section may include a plurality of virtual channel information. However, a single set of virtual channel information is not divided into two or more sections. At this point, the receiving system may parse and decode the data for the data service that are transmitting by using only the tables included in the PSI, or only the tables included in the PISP, or a combination of tables included in both the PSI and the PSIP. In order to parse and decode the data for the data service, at least one of the PAT and PMT included in the PSI, and the VCT included in the PSIP is required. For example, the PAT may include the system information for transmitting the data corresponding to the data service, and the PID of the PMT corresponding to the data service data (or program number). The PMT may include the PID of the TS packet used for transmitting the data service data. The VCT may include information on the virtual channel for transmitting the data service data, and the PID of the TS packet for transmitting the data service data.

Meanwhile, depending upon the embodiment of the present invention, a DVB-SI may be applied instead of the PSIP. The DVB-SI may include a network information table (NIT), a service description table (SDT), an event information table (EIT), and a time and data table (TDT). The DVB-SI may be used in combination with the above-described PSI. Herein, the NIT divides the services corresponding to particular network providers by specific groups. The NIT includes all tuning information that are used during the IRD set-up. The NIT may be used for informing or notifying any change in the tuning information. The SDT includes the service name and different parameters associated with each service corresponding to a particular MPEG multiplex. The EIT is used for transmitting information associated with all events occurring in the MPEG multiplex. The EIT includes information on the current transmission and also includes information selectively containing different transmission streams that may be received by the IRD. And, the TDT is used for updating the clock included in the IRD.

Furthermore, three selective SI tables (i.e., a bouquet associate table (BAT), a running status table (RST), and a stuffing table (ST)) may also be included. More specifically, the bouquet associate table (BAT) provides a service grouping method enabling the IRD to provide services to the viewers. Each specific service may belong to at least one 'bouquet' unit. A running status table (RST) section is used for promptly and instantly updating at least one event execution status. The execution status section is transmitted only once at the changing point of the event status. Other SI tables are generally transmitted several times. The stuffing table (ST) may be used for replacing or discarding a subsidiary table or the entire SI tables.

In the present invention, the enhanced data included in the payload within the TS packet consist of a digital storage media-command and control (DSM-CC) section format. However, the TS packet including the data service data may correspond either to a packetized elementary stream (PES) type or to a section type. More specifically, either the PES type data service data configure the TS packet, or the section type data service data configure the TS packet. The TS packet configured of the section type data will be given as the example of the present invention. At this point, the data service data are includes in the digital storage media-command and control (DSM-CC) section. Herein, the DSM-CC section is then configured of a 188-byte unit TS packet.

Furthermore, the packet identification of the TS packet configuring the DSM-CC section is included in a data service table (DST). When transmitting the DST, '0x95' is assigned as the value of a stream_type field included in the service location descriptor of the PMT or the VCT. More specifically, when the PMT or VCT stream_type field value is '0x95', the receiving system may acknowledge that data broadcasting including enhanced data (i.e., the enhanced data) is being received. At this point, the enhanced data may be transmitted by a data carousel method. The data carousel method corresponds to repeatedly transmitting identical data on a regular basis.

At this point, according to the control of the data decoder 1010, the demultiplexer 1003 performs section filtering, thereby discarding repetitive sections and outputting only the non-repetitive sections to the data decoder 1010. The demultiplexer 1003 may also output only the sections configuring desired tables (e.g., VCT) to the data decoder 1010 by section filtering. Herein, the VCT may include a specific descriptor for the enhanced data. However, the present invention does not exclude the possibilities of the enhanced data being included in other tables, such as the PMT. The section filtering method may include a method of verifying the PID of a table defined by the MGT, such as the VCT, prior to performing the section filtering process. Alternatively, the section filtering method may also include a method of directly performing the section filtering process without verifying the MGT, when the VCT includes a fixed PID (i.e., a base PID). At this point, the demultiplexer 1003 performs the section filtering process by referring to a table_id field, a version_number field, a section_number field, etc.

As described above, the method of defining the PID of the VCT broadly includes two different methods. Herein, the PID of the VCT is a packet identifier required for identifying the VCT from other tables. The first method consists of setting the PID of the VCT so that it is dependent to the MGT. In this case, the receiving system cannot directly verify the VCT among the many PSI and/or PSIP tables. Instead, the receiving system must check the PID defined in the MGT in order to read the VCT. Herein, the MGT defines the PIT, size, version number, and so on, of diverse tables. The second method consists of setting the PID of the VCT so that the PID is given a base PID value (or a fixed PID value), thereby being independent from the MGT. In this case, unlike in the first method, the VCT according to the present invention may be identified without having to verify every single PID included in the MGT. Evidently, an agreement on the base PID must be previously made between the transmitting system and the receiving system.

Meanwhile, in the embodiment of the present invention, the demultiplexer 1003 may output only an application information table (AIT) to the data decoder 1010 by section filtering. The AIT includes information on an application being operated in the receiver for the data service. The AIT may also be referred to as an XAIT, and an AMT. Therefore, any table including application information may correspond to the following description. When the AIT is transmitted, a value of '0x05' may be assigned to a stream_type field of the PMT. The AIT may include application information, such as application name, application version, application priority, application ID, application status (i.e., auto-start, user-specific settings, kill, etc.), application type (i.e., Java or HTML), position (or location) of stream including application class and data files, application platform directory, and location of application icon.

In the method for detecting application information for the data service by using the AIT, component_tag, original_network_id, transport_stream_id, and service_id fields may be used for detecting the application information. The component_tag field designates an elementary stream carrying a DSI of a corresponding object carousel. The original_network_id field indicates a DVB-SI original_network_id of the TS providing transport connection. The transport_stream_id field indicates the MPEG TS of the TS providing transport connection, and the service_id field indicates the DVB-SI of the service providing transport connection. Information on a specific channel may be obtained by using the original_network_id field, the transport_stream_id field, and the service_id field. The data service data, such as the application data, detected by using the above-described method may be stored in the second memory 1011 by the data decoder 1010.

The data decoder 1010 parses the DSM-CC section configuring the demultiplexed enhanced data. Then, the enhanced data corresponding to the parsed result are stored as a database in the second memory 1011. The data decoder 1010 groups a plurality of sections having the same table identification (table_id) so as to configure a table, which is then parsed. Thereafter, the parsed result is stored as a database in the second memory 1011. At this point, by parsing data and/or sections, the data decoder 1010 reads all of the remaining actual section data that are not section-filtered by the demultiplexer 1003. Then, the data decoder 1010 stores the read data to the second memory 1011. The second memory 1011 corresponds to a table and data carousel database storing system information parsed from tables and enhanced data parsed from the DSM-CC section. Herein, a table_id field, a section_number field, and a last_section_number field included in the table may be used to indicate whether the corresponding table is configured of a single section or a plurality of sections. For example, TS packets having the PID of the VCT are grouped to form a section, and sections having table identifiers allocated to the VCT are grouped to form the VCT.

When the VCT is parsed, information on the virtual channel to which enhanced data are transmitted may be obtained. The obtained application identification information, service component identification information, and service information corresponding to the data service may either be stored in the second memory 1011 or be outputted to the data broadcasting application manager 1013. In addition, reference may be made to the application identification information, service component identification information, and service information in order to decode the data service data. Alternatively, such information may also prepare the operation of the application program for the data service. Furthermore, the data decoder 1010 controls the demultiplexing of the system information table, which corresponds to the information table associated with the channel and events. Thereafter, an A.V PID list may be transmitted to the channel manager 1007.

The channel manager 1007 may refer to the channel map 1008 in order to transmit a request for receiving system-related information data to the data decoder 1010, thereby receiving the corresponding result. In addition, the channel manager 1007 may also control the channel tuning of the tuner 1001. Furthermore, the channel manager 1007 may directly control the demultiplexer 1003, so as to set up the A/V PID, thereby controlling the audio decoder 1004 and the video decoder 1005. The audio decoder 1004 and the video decoder 1005 may respectively decode and output the audio data and video data demultiplexed from the main data packet. Alternatively, the audio decoder 1004 and the video decoder 1005 may respectively decode and output the audio data and video data demultiplexed from the enhanced data packet. Meanwhile, when the enhanced data include data service data, and also audio data and video data, it is apparent that the audio data and video data demultiplexed by the demultiplexer 1003 are respectively decoded by the audio decoder 1004 and the video decoder 1005. For example, an audio-coding (AC)-3 decoding algorithm may be applied to the audio decoder 1004, and a MPEG-2 decoding algorithm may be applied to the video decoder 1005.

Meanwhile, the native TV application manager 1006 operates a native application program stored in the first memory 1009, thereby performing general functions such as channel change. The native application program refers to software stored in the receiving system upon shipping of the product. More specifically, when a user request (or command) is transmitted to the receiving system through a user interface (UI), the native TV application manger 1006 displays the user request on a screen through a graphic user interface (GUI), thereby responding to the user's request. The user interface receives the user request through an input device, such as a remote controller, a key pad, a jog controller, an a touch-screen provided on the screen, and then outputs the received user request to the native TV application manager 1006 and the data broadcasting application manager 1013. Furthermore, the native TV application manager 1006 controls the channel manager 1007, thereby controlling channel-associated, such as the management of the channel map 1008, and controlling the data decoder 1010. The native TV application manager 1006 also controls the GUI of the overall receiving system, thereby storing the user request and status of the receiving system in the first memory 1009 and restoring the stored information.

The channel manager 1007 controls the tuner 1001 and the data decoder 1010, so as to managing the channel map 1008 so that it can respond to the channel request made by the user. More specifically, channel manager 1007 sends a request to the data decoder 1010 so that the tables associated with the channels that are to be tuned are parsed. The results of the parsed tables are reported to the channel manager 1007 by the data decoder 1010. Thereafter, based on the parsed results, the channel manager 1007 updates the channel map 1008 and sets up a PID in the demultiplexer 1003 for demultiplexing the tables associated with the data service data from the enhanced data.

The system manager 1012 controls the booting of the receiving system by turning the power on or off. Then, the system manager 1012 stores ROM images (including downloaded software images) in the first memory 1009. More specifically, the first memory 1009 stores management programs such as operating system (OS) programs required for managing the receiving system and also application program executing data service functions. The application program is a program processing the data service data stored in the second memory 1011 so as to provide the user with the data service. If the data service data are stored in the second memory loll, the corresponding data service data are processed by the above-described application program or by other application programs, thereby being provided to the user. The management program and application program stored in the first memory 1009 may be updated or corrected to a newly downloaded program. Furthermore, the storage of the stored management program and application program is maintained without being deleted even if the power of the system is shut down. Therefore, when the power is supplied the programs may be executed without having to be newly downloaded once again.

The application program for providing data service according to the present invention may either be initially stored in the first memory 1009 upon the shipping of the receiving system, or be stored in the first 1009 after being downloaded. The application program for the data service (i.e., the data service providing application program) stored in the first memory 1009 may also be deleted, updated, and corrected. Furthermore, the data service providing application program may be downloaded and executed along with the data service data each time the data service data are being received.

When a data service request is transmitted through the user interface, the data broadcasting application manager 1013 operates the corresponding application program stored in the first memory 1009 so as to process the requested data, thereby providing the user with the requested data service. And, in order to provide such data service, the data broadcasting application manager 1013 supports the graphic user interface (GUI). Herein, the data service may be provided in the form of text (or short message service (SMS)), voice message, still image, and moving image. The data broadcasting application manager 1013 may be provided with a platform for executing the application program stored in the first memory 1009. The platform may be, for example, a Java virtual machine for executing the Java program. Hereinafter, an example of the data broadcasting application manager 1013 executing the data service providing application program stored in the first memory 1009, so as to process the data service data stored in the second memory 1011, thereby providing the user with the corresponding data service will now be described in detail.

Assuming that the data service corresponds to a traffic information service, the data service according to the present invention is provided to the user of a receiver that is not equipped with an electronic map and/or a GPS system in the form of at least one of a text (or short message service (SMS)), a voice message, a graphic message, a still image, and a moving image. In this case, is a GPS module is mounted on the receiving system shown in FIG. 13, the GPS module receives satellite signals transmitted from a plurality of low earth orbit satellites and extracts the current position (or location) information (e.g., longitude, latitude, altitude), thereby outputting the extracted information to the data broadcasting application manager 1013.

At this point, it is assumed that the electronic map including information on each link and nod and other diverse graphic information are stored in one of the second memory 1011, the first memory 1009, and another memory that is not shown. More specifically, according to the request made by the data broadcasting application manager 1013, the data service data stored in the second memory 1011 are read and inputted to the data broadcasting application manager 1013. The data broadcasting application manager 1013 translates (or deciphers) the data service data read from the second memory 1011, thereby extracting the necessary information according to the contents of the message and/or a control signal.

Figure 14:
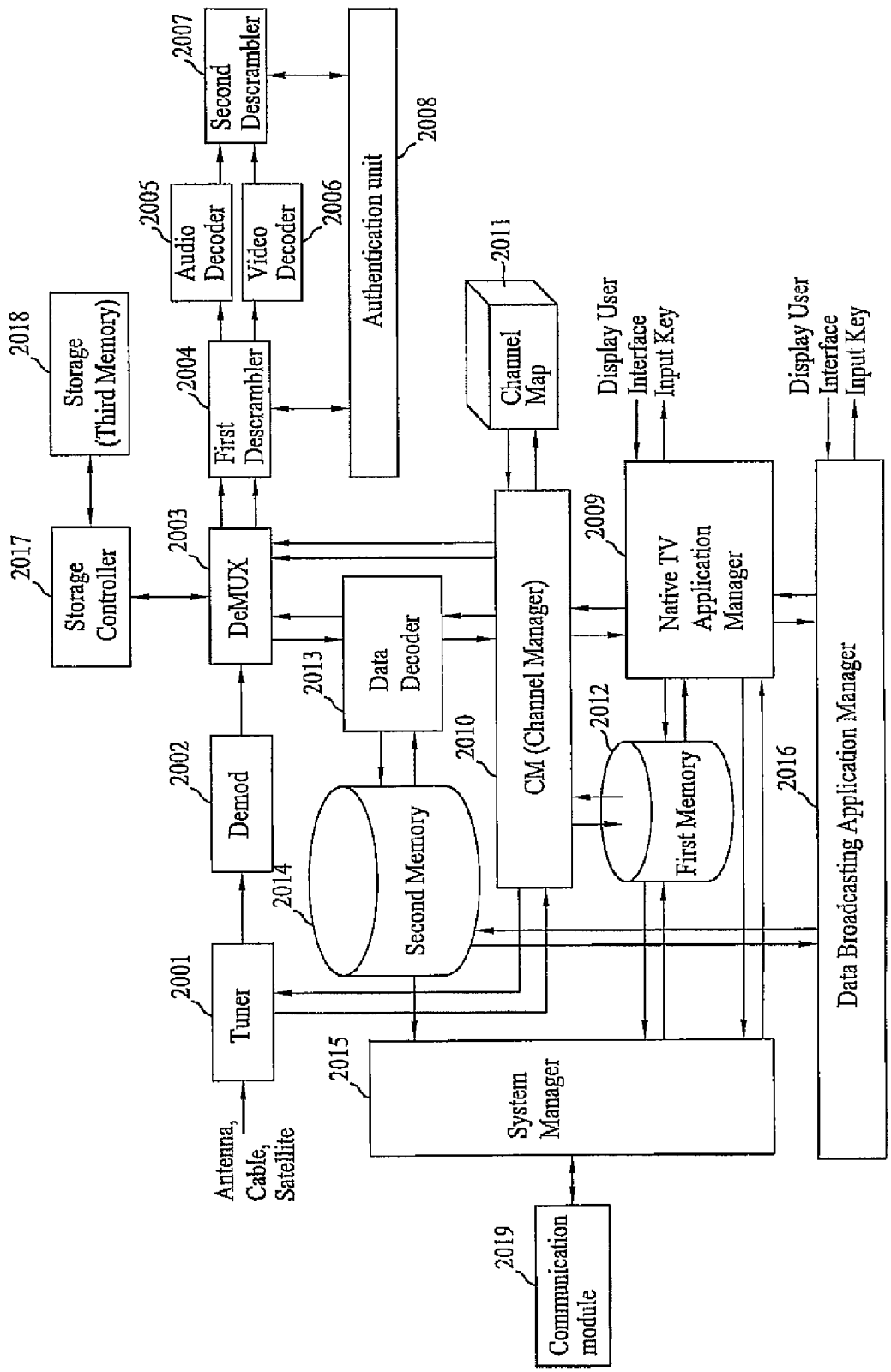
FIG. 14 illustrates a block diagram showing the structure of a digital broadcast (or television or DTV) receiver according to another embodiment of the present invention.

FIG. 14 illustrates a block diagram showing the structure of a digital broadcast (or television) receiver according to another embodiment of the present invention. Referring to FIG. 14, the digital broadcast receiver includes a tuner 2001, a demodulating unit 2002, a demultiplexer 2003, a first descrambler 2004, an audio decoder 2005, a video decoder 2006, a second descrambler 2007, an authentication unit 2008, a native TV application manager 2009, a channel manager 2010, a channel map 2011, a first memory 2012, a data decoder 2013, a second memory 2014, a system manager 2015, a data broadcasting application manager 2016, a storage controller 2017, a third memory 2018, and a telecommunication module 2019. Herein, the third memory 2018 is a mass storage device, such as a hard disk drive (HDD) or a memory chip. Also, during the description of the digital broadcast (or television or DTV) receiver shown in FIG. 14, the components that are identical to those of the digital broadcast receiver of FIG. 13 will be omitted for simplicity.

As described above, in order to provide services for preventing illegal duplication (or copies) or illegal viewing of the enhanced data and/or main data that are transmitted by using a broadcast network, and to provide paid broadcast services, the transmitting system may generally scramble and transmit the broadcast contents. Therefore, the receiving system needs to descramble the scrambled broadcast contents in order to provide the user with the proper broadcast contents. Furthermore, the receiving system may generally be processed with an authentication process with an authentication means before the descrambling process. Hereinafter, the receiving system including an authentication means and a descrambling means according to an embodiment of the present invention will now be described in detail.

According to the present invention, the receiving system may be provided with a descrambling means receiving scrambled broadcasting contents and an authentication means authenticating (or verifying) whether the receiving system is entitled to receive the descrambled contents. Hereinafter, the descrambling means will be referred to as first and second descramblers 2004 and 2007, and the authentication means will be referred to as an authentication unit 2008. Such naming of the corresponding components is merely exemplary and is not limited to the terms suggested in the description of the present invention. For example, the units may also be referred to as a decryptor. Although FIG. 14 illustrates an example of the descramblers 2004 and 2007 and the authentication unit 2008 being provided inside the receiving system, each of the descramblers 2004 and 2007 and the authentication unit 2008 may also be separately provided in an internal or external module. Herein, the module may include a slot type, such as a SD or CF memory, a memory stick type, a USB type, and so on, and may be detachably fixed to the receiving system.

As described above, when the authentication process is performed successfully by the authentication unit 2008, the scrambled broadcasting contents are descrambled by the descramblers 2004 and 2007, thereby being provided to the user. At this point, a variety of the authentication method and descrambling method may be used herein. However, an agreement on each corresponding method should be made between the receiving system and the transmitting system. Hereinafter, the authentication and descrambling methods will now be described, and the description of identical components or process steps will be omitted for simplicity.

The receiving system including the authentication unit 2008 and the descramblers 2004 and 2007 will now be described in detail. The receiving system receives the scrambled broadcasting contents through the tuner 2001 and the demodulating unit 2002. Then, the system manager 2015 decides whether the received broadcasting contents have been scrambled. Herein, the demodulating unit 2002 may be included as a demodulating means according to embodiments of the present invention as described in FIG. 10 and FIG. 12. However, the present invention is not limited to the examples given in the description set forth herein. If the system manager 2015 decides that the received broadcasting contents have been scrambled, then the system manager 2015 controls the system to operate the authentication unit 2008. As described above, the authentication unit 2008 performs an authentication process in order to decide whether the receiving system according to the present invention corresponds to a legitimate host entitled to receive the paid broadcasting service. Herein, the authentication process may vary in accordance with the authentication methods.

For example, the authentication unit 2008 may perform the authentication process by comparing an IP address of an IP datagram within the received broadcasting contents with a specific address of a corresponding host. At this point, the specific address of the corresponding receiving system (or host) may be a MAC address. More specifically, the authentication unit 2008 may extract the IP address from the decapsulated IP datagram, thereby obtaining the receiving system information that is mapped with the IP address. At this point, the receiving system should be provided, in advance, with information (e.g., a table format) that can map the IP address and the receiving system information. Accordingly, the authentication unit 2008 performs the authentication process by determining the conformity between the address of the corresponding receiving system and the system information of the receiving system that is mapped with the IP address. In other words, if the authentication unit 2008 determines that the two types of information conform to one another, then the authentication unit 2008 determines that the receiving system is entitled to receive the corresponding broadcasting contents.

In another example, standardized identification information is defined in advance by the receiving system and the transmitting system. Then, the identification information of the receiving system requesting the paid broadcasting service is transmitted by the transmitting system. Thereafter, the receiving system determines whether the received identification information conforms with its own unique identification number, so as to perform the authentication process. More specifically, the transmitting system creates a database for storing the identification information (or number) of the receiving system requesting the paid broadcasting service. Then, if the corresponding broadcasting contents are scrambled, the transmitting system includes the identification information in the EMM, which is then transmitted to the receiving system.

If the corresponding broadcasting contents are scrambled, messages (e.g., entitlement control message (ECM), entitlement management message (EMM)), such as the CAS information, mode information, message position information, that are applied to the scrambling of the broadcasting contents are transmitted through a corresponding data header or anther data packet. The ECM may include a control word (CW) used for scrambling the broadcasting contents. At this point, the control word may be encoded with an authentication key. The EMM may include an authentication key and entitlement information of the corresponding data. Herein, the authentication key may be encoded with a receiver-specific distribution key. In other words, assuming that the enhanced data are scrambled by using the control word, and that the authentication information and the descrambling information are transmitted from the transmitting system, the transmitting system encodes the CW with the authentication key and, then, includes the encoded CW in the entitlement control message (ECM), which is then transmitted to the receiving system. Furthermore, the transmitting system includes the authentication key used for encoding the CW and the entitlement to receive data (or services) of the receiving system (i.e., a standardized serial number of the receiving system that is entitled to receive the corresponding broadcasting service or data) in the entitlement management message (EMM), which is then transmitted to the receiving system.

Accordingly, the authentication unit 2008 of the receiving system extracts the identification information of the receiving system and the identification information included in the EMM of the broadcasting service that is being received. Then, the authentication unit 2008 determines whether the identification information conform to each other, so as to perform the authentication process. More specifically, if the authentication unit 2008 determines that the information conform to each other, then the authentication unit 2008 eventually determines that the receiving system is entitled to receive the request broadcasting service.

In yet another example, the authentication unit 2008 of the receiving system may be detachably fixed to an external module. In this case, the receiving system is interfaced with the external module through a common interface (CI). In other words, the external module may receive the data scrambled by the receiving system through the common interface, thereby performing the descrambling process of the received data. Alternatively, the external module may also transmit only the information required for the descrambling process to the receiving system. The common interface is configured on a physical layer and at least one protocol layer. Herein, in consideration of any possible expansion of the protocol layer in a later process, the corresponding protocol layer may be configured to have at least one layer that can each provide an independent function.

The external module may either consist of a memory or card having information on the key used for the scrambling process and other authentication information but not including any descrambling function, or consist of a card having the above-mentioned key information and authentication information and including the descrambling function. Both the receiving system and the external module should be authenticated in order to provide the user with the paid broadcasting service provided (or transmitted) from the transmitting system. Therefore, the transmitting system can only provide the corresponding paid broadcasting service to the authenticated pair of receiving system and external module.

Additionally, an authentication process should also be performed between the receiving system and the external module through the common interface. More specifically, the module may communicate with the system manager 2015 included in the receiving system through the common interface, thereby authenticating the receiving system. Alternatively, the receiving system may authenticate the module through the common interface. Furthermore, during the authentication process, the module may extract the unique ID of the receiving system and its own unique ID and transmit the extracted IDs to the transmitting system. Thus, the transmitting system may use the transmitted ID values as information determining whether to start the requested service or as payment information. Whenever necessary, the system manager 2015 transmits the payment information to the remote transmitting system through the telecommunication module 2019.

The authentication unit 2008 authenticates the corresponding receiving system and/or the external module. Then, if the authentication process is successfully completed, the authentication unit 2008 certifies the corresponding receiving system and/or the external module as a legitimate system and/or module entitled to receive the requested paid broadcasting service. In addition, the authentication unit 2008 may also receive authentication-associated information from a mobile telecommunications service provider to which the user of the receiving system is subscribed, instead of the transmitting system providing the requested broadcasting service. In this case, the authentication-association information may either be scrambled by the transmitting system providing the broadcasting service and, then, transmitted to the user through the mobile telecommunications service provider, or be directly scrambled and transmitted by the mobile telecommunications service provider. Once the authentication process is successfully completed by the authentication unit 2008, the receiving system may descramble the scrambled broadcasting contents received from the transmitting system. At this point, the descrambling process is performed by the first and second descramblers 2004 and 2007. Herein, the first and second descramblers 2004 and 2007 may be included in an internal module or an external module of the receiving system.

The receiving system is also provided with a common interface for communicating with the external module including the first and second descramblers 2004 and 2007, so as to perform the descrambling process. More specifically, the first and second descramblers 2004 and 2007 may be included in the module or in the receiving system in the form of hardware, middleware or software. Herein, the descramblers 2004 and 2007 may be included in any one of or both of the module and the receiving system. If the first and second descramblers 2004 and 2007 are provided inside the receiving system, it is advantageous to have the transmitting system (i.e., at least any one of a service provider and a broadcast station) scramble the corresponding data using the same scrambling method.

Alternatively, if the first and second descramblers 2004 and 2007 are provided in the external module, it is advantageous to have each transmitting system scramble the corresponding data using different scrambling methods. In this case, the receiving system is not required to be provided with the descrambling algorithm corresponding to each transmitting system. Therefore, the structure and size of receiving system may be simplified and more compact. Accordingly, in this case, the external module itself may be able to provide CA functions, which are uniquely and only provided by each transmitting systems, and functions related to each service that is to be provided to the user. The common interface enables the various external modules and the system manager 2015, which is included in the receiving system, to communicate with one another by a single communication method. Furthermore, since the receiving system may be operated by being connected with at least one or more modules providing different services, the receiving system may be connected to a plurality of modules and controllers.

In order to maintain successful communication between the receiving system and the external module, the common interface protocol includes a function of periodically checking the status of the opposite correspondent. By using this function, the receiving system and the external module is capable of managing the status of each opposite correspondent. This function also reports the user or the transmitting system of any malfunction that may occur in any one of the receiving system and the external module and attempts the recovery of the malfunction.

In yet another example, the authentication process may be performed through software. More specifically, when a memory card having CAS software downloaded, for example, and stored therein in advance is inserted in the receiving system, the receiving system receives and loads the CAS software from the memory card so as to perform the authentication process. In this example, the CAS software is read out from the memory card and stored in the first memory 2012 of the receiving system. Thereafter, the CAS software is operated in the receiving system as an application program. According to an embodiment of the present invention, the CAS software is mounted on (or stored) in a middleware platform and, then executed. A Java middleware will be given as an example of the middleware included in the present invention. Herein, the CAS software should at least include information required for the authentication process and also information required for the descrambling process.

Therefore, the authentication unit 2008 performs authentication processes between the transmitting system and the receiving system and also between the receiving system and the memory card. At this point, as described above, the memory card should be entitled to receive the corresponding data and should include information on a normal receiving system that can be authenticated. For example, information on the receiving system may include a unique number, such as a standardized serial number of the corresponding receiving system. Accordingly, the authentication unit 2008 compares the standardized serial number included in the memory card with the unique information of the receiving system, thereby performing the authentication process between the receiving system and the memory card.

If the CAS software is first executed in the Java middleware base, then the authentication between the receiving system and the memory card is performed. For example, when the unique number of the receiving system stored in the memory card conforms to the unique number of the receiving system read from the system manager 2015, then the memory card is verified and determined to be a normal memory card that may be used in the receiving system. At this point, the CAS software may either be installed in the first memory 2012 upon the shipping of the present invention, or be downloaded to the first memory 2012 from the transmitting system or the module or memory card, as described above. Herein, the descrambling function may be operated by the data broadcasting application manger 2016 as an application program.

Thereafter, the CAS software parses the EMM/ECM packets outputted from the demultiplexer 2003, so as to verify whether the receiving system is entitled to receive the corresponding data, thereby obtaining the information required for descrambling (i.e., the CW) and providing the obtained CW to the descramblers 2004 and 2007. More specifically, the CAS software operating in the Java middleware platform first reads out the unique (or serial) number of the receiving system from the corresponding receiving system and compares it with the unique number of the receiving system transmitted through the EMM, thereby verifying whether the receiving system is entitled to receive the corresponding data. Once the receiving entitlement of the receiving system is verified, the corresponding broadcasting service information transmitted to the ECM and the entitlement of receiving the corresponding broadcasting service are used to verify whether the receiving system is entitled to receive the corresponding broadcasting service. Once the receiving system is verified to be entitled to receive the corresponding broadcasting service, the authentication key transmitted to the EMM is used to decode (or decipher) the encoded CW, which is transmitted to the ECM, thereby transmitting the decoded CW to the descramblers 2004 and 2007. Each of the descramblers 2004 and 2007 uses the CW to descramble the broadcasting service.

Meanwhile, the CAS software stored in the memory card may be expanded in accordance with the paid service which the broadcast station is to provide. Additionally, the CAS software may also include other additional information other than the information associated with the authentication and descrambling. Furthermore, the receiving system may download the CAS software from the transmitting system so as to upgrade (or update) the CAS software originally stored in the memory card. As described above, regardless of the type of broadcast receiver, as long as an external memory interface is provided, the present invention may embody a CAS system that can meet the requirements of all types of memory card that may be detachably fixed to the receiving system. Thus, the present invention may realize maximum performance of the receiving system with minimum fabrication cost, wherein the receiving system may receive paid broadcasting contents such as broadcast programs, thereby acknowledging and regarding the variety of the receiving system. Moreover, since only the minimum application program interface is required to be embodied in the embodiment of the present invention, the fabrication cost may be minimized, thereby eliminating the manufacturer's dependence on CAS manufacturers. Accordingly, fabrication costs of CAS equipments and management systems may also be minimized.

Meanwhile, the descramblers 2004 and 2007 may be included in the module either in the form of hardware or in the form of software. In this case, the scrambled data that being received are descrambled by the module and then demodulated. Also, if the scrambled data that are being received are stored in the third memory 2018, the received data may be descrambled and then stored, or stored in the memory at the point of being received and then descrambled later on prior to being played (or reproduced). Thereafter, in case scramble/descramble algorithms are provided in the storage controller 2017, the storage controller 2017 scrambles the data that are being received once again and then stores the re-scrambled data to the third memory 2018.

In yet another example, the descrambled broadcasting contents (transmission of which being restricted) are transmitted through the broadcasting network. Also, information associated with the authentication and descrambling of data in order to disable the receiving restrictions of the corresponding data are transmitted and/or received through the telecommunications module 2019. Thus, the receiving system is able to perform reciprocal (or two-way) communication. The receiving system may either transmit data to the telecommunication module within the transmitting system or be provided with the data from the telecommunication module within the transmitting system. Herein, the data correspond to broadcasting data that are desired to be transmitted to or from the transmitting system, and also unique information (i.e., identification information) such as a serial number of the receiving system or MAC address.

The telecommunication module 2019 included in the receiving system provides a protocol required for performing reciprocal (or two-way) communication between the receiving system, which does not support the reciprocal communication function, and the telecommunication module included in the transmitting system. Furthermore, the receiving system configures a protocol data unit (PDU) using a tag-length-value (TLV) coding method including the data that are to be transmitted and the unique information (or ID information). Herein, the tag field includes indexing of the corresponding PDU. The length field includes the length of the value field. And, the value field includes the actual data that are to be transmitted and the unique number (e.g., identification number) of the receiving system.

The receiving system may configure a platform that is equipped with the Java platform and that is operated after downloading the Java application of the transmitting system to the receiving system through the network. In this case, a structure of downloading the PDU including the tag field arbitrarily defined by the transmitting system from a storage means included in the receiving system and then transmitting the downloaded PDU to the telecommunication module 2019 may also be configured. Also, the PDU may be configured in the Java application of the receiving system and then outputted to the telecommunication module 2019. The PDU may also be configured by transmitting the tag value, the actual data that are to be transmitted, the unique information of the corresponding receiving system from the Java application and by performing the TLV coding process in the receiving system. This structure is advantageous in that the firmware of the receiving system is not required to be changed even if the data (or application) desired by the transmitting system is added.

The telecommunication module within the transmitting system either transmits the PDU received from the receiving system through a wireless data network or configures the data received through the network into a PDU which is transmitted to the host. At this point, when configuring the PDU that is to be transmitted to the host, the telecommunication module within the transmitting end may include unique information (e.g., IP address) of the transmitting system which is located in a remote location. Additionally, in receiving and transmitting data through the wireless data network, the receiving system may be provided with a common interface, and also provided with a WAP, CDMA 1x EV-DO, which can be connected through a mobile telecommunication base station, such as CDMA and GSM, and also provided with a wireless LAN, mobile internet, WiBro, WiMax, which can be connected through an access point. The above-described receiving system corresponds to the system that is not equipped with a telecommunication function. However, a receiving system equipped with telecommunication function does not require the telecommunication module 2019.

The broadcasting data being transmitted and received through the above-described wireless data network may include data required for performing the function of limiting data reception. Meanwhile, the demultiplexer 2003 receives either the real-time data outputted from the demodulating unit 2002 or the data read from the third memory 2018, thereby performing demultiplexing. In this embodiment of the present invention, the demultiplexer 2003 performs demultiplexing on the enhanced data packet. Similar process steps have already been described earlier in the description of the present invention. Therefore, a detailed of the process of demultiplexing the enhanced data will be omitted for simplicity.

The first descrambler 2004 receives the demultiplexed signals from the demultiplexer 2003 and then descrambles the received signals. At this point, the first descrambler 2004 may receive the authentication result received from the authentication unit 2008 and other data required for the descrambling process, so as to perform the descrambling process. The audio decoder 2005 and the video decoder 2006 receive the signals descrambled by the first descrambler 2004, which are then decoded and outputted. Alternatively, if the first descrambler 2004 did not perform the descrambling process, then the audio decoder 2005 and the video decoder 2006 directly decode and output the received signals. In this case, the decoded signals are received and then descrambled by the second descrambler 2007 and processed accordingly.

As described above, the DTV transmitter and the method of coding main and enhanced data according to the present invention has the following advantages. More specifically, the DTV transmitter and the method of coding main and enhanced data according to the present invention are highly protected against (or resistant to) any error that may occur when transmitting supplemental data through a channel. And, the present invention is also highly compatible to the conventional receiver. Moreover, the present invention may also receive the supplemental data without any error even in channels having severe ghost effect and noise.

Additionally, by inserting known data in a specific place (or position) of the data domain and transmitting the processed data, the receiving performance of the digital broadcast (or digital television) receiver liable to a frequent change in channel may be enhanced. The present invention is even more effective when applied to mobile and portable receivers, which are also liable to a frequent change in channel and which require protection (or resistance) against intense noise. Furthermore, ½-rate coding is additionally performed on the enhanced data symbol, which bypasses the pre-coder so as to be outputted. Thus, the problems of noise and ghost effect in the channel may be resolved, thereby enhancing the performance.

Furthermore, by outputting the known data as the lower bit of the enhanced data symbol and trellis-encoding the outputted lower bit, or by outputting the memory value of the trellis encoder as the upper bit of the enhanced data symbol and trellis-encoding the outputted memory value, the slicing performance of the receiver may also be enhanced. Finally, when the input data correspond to the enhanced data packet, by deciding the RS parity byte place so that the RS parity bytes are outputted the latest among the bytes in the domain excluding the MPEG header bytes and the known data bytes, at the output of the data interleaver, the degree of freedom for deciding the inserting position of the known data sequence may be increased, thereby enabling a long known data sequence to be provided consecutively to the receiver.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A digital television (DTV) transmitter for processing main and enhanced data for transmission, the DTV transmitter comprising:
    a pre-coder for pre-coding the enhanced data for forward error correction (FEC);
    a data formatter for generating enhanced data packets including the pre-coded enhanced data;
    a multiplexer for multiplexing the enhanced data packets with main data packets including the main data;
    a Reed-Solomon (RS) encoder for RS-coding the multiplexed main and enhanced data packets, the RS encoder adding systematic RS parity data to the main data packets and adding non-systematic RS parity data to the enhanced data packets;
    a data interleaver for interleaving the RS-coded main and enhanced data packets, wherein the non-systematic RS parity data are placed at predetermined positions within the interleaved enhanced data packets; and
    a trellis encoder for trellis-encoding the interleaved main and enhanced data packets,
    wherein the trellis encoder is initialized at each start of a plurality of known data sequences, and
    wherein the interleaved enhanced data packets include enhanced data encoded with a coding rate of 1/L, wherein L is greater than 1.

2. The DTV transmitter of claim 1, wherein the data interleaver outputs at least two known data sequences which are spaced N data segments apart.

3. A method of processing main and enhanced data in a digital television (DTV) transmitter, the method comprising:
    pre-coding the enhanced data for forward error correction (FEC);
    generating enhanced data packets including the pre-coded enhanced data;
    multiplexing the enhanced data packets with main data packets including the main data;
    Reed-Solomon (RS)-coding the multiplexed main and enhanced data packets by adding systematic RS parity data to the main data packets and adding non-systematic RS parity data to the enhanced data packets;
    interleaving, by a data interleaver, the RS-coded main and enhanced data packets, wherein the non-systematic RS parity data are placed at predetermined positions within the interleaved enhanced data packets; and
    trellis-encoding, by a trellis encoder, the interleaved main and enhanced data packets,
    wherein the trellis encoder is initialized at each start of a plurality of known data sequences, and
    wherein the interleaved enhanced data packets include enhanced data encoded with a coding rate of 1/L, wherein L is greater than 1.

4. The method of claim 3, wherein the data interleaver outputs at least two known data sequences which are spaced N data segments apart.

5. A digital television (DTV) receiver for processing digital broadcast data, the DTV receiver comprising:
    a tuner for receiving a DTV signal comprising main data and enhanced data multiplexed with the main data, wherein the main and enhanced data result from:
        pre-coding enhanced data for forward error correction (FEC),
        generating enhanced data packets including the pre-coded enhanced data,
        multiplexing the enhanced data packets with main data packets including main data,
        Reed-Solomon (RS)-coding the multiplexed main and enhanced data packets by adding systematic RS parity data to the main data packets and adding non-nonsystematic RS parity data to the enhanced data packets,
        interleaving, by a data interleaver, the RS-coded main and enhanced data packets, wherein the non-systematic RS parity data are placed at predetermined positions within the interleaved enhanced data packets, and
        trellis-encoding, by a trellis encoder, the interleaved main and enhanced data packets,
        wherein the trellis encoder is initialized at each start of a plurality of known data sequences, and
        wherein the interleaved enhanced data packets include enhanced data encoded with a coding rate of 1/L, wherein L is greater than 1;

a first decoder for inner decoding the DTV signal; and
a second decoder for outer decoding the inner-decoded DTV signal.

6. The DTV receiver of claim 5, wherein the data interleaver outputs at least two known data sequences which are spaced N data segments apart.

7. A method of processing digital broadcast data in a digital television (DTV) receiver, the method comprising:
receiving a DTV signal comprising main data and enhanced data multiplexed with the main data, wherein the main and enhanced data result from:
pre-coding enhanced data for forward error correction (FEC),
generating enhanced data packets including the pre-coded enhanced data,
multiplexing the enhanced data packets with main data packets including main data,
Reed-Solomon (RS)-coding the multiplexed main and enhanced data packets by adding systematic RS parity data to the main data packets and adding non-nonsystematic RS parity data to the enhanced data packets,
interleaving the RS-coded main and enhanced data packets by a data interleaver, wherein the non-systematic RS parity data are placed at predetermined positions in the interleaved enhanced data packets, and
trellis-encoding, by a trellis encoder, the interleaved main and enhanced data packets,
wherein the trellis encoder is initialized at each start of a plurality of known data sequences, and
wherein the interleaved enhanced data packets include enhanced data encoded with a coding rate of 1/L, wherein L is greater than 1;
inner decoding the DTV signal; and
outer decoding the inner-decoded DTV signal.

8. The method of claim 7, wherein the data interleaver outputs at least two known data sequences which are spaced N data segments apart.

* * * * *